US008705585B2

(12) United States Patent
Sato et al.

(10) Patent No.: US 8,705,585 B2
(45) Date of Patent: Apr. 22, 2014

(54) SURFACE-EMITTING LASER ARRAY, OPTICAL SCANNING DEVICE, AND IMAGE FORMING DEVICE

(71) Applicants: Shunichi Sato, Miyagi (JP); Akihiro Itoh, Miyagi (JP); Satoru Sugawara, Miyagi (JP); Hiroyoshi Shouji, Miyagi (JP)

(72) Inventors: Shunichi Sato, Miyagi (JP); Akihiro Itoh, Miyagi (JP); Satoru Sugawara, Miyagi (JP); Hiroyoshi Shouji, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/866,445

(22) Filed: Apr. 19, 2013

(65) Prior Publication Data

US 2013/0230070 A1    Sep. 5, 2013

Related U.S. Application Data

(63) Continuation of application No. 12/090,467, filed on Apr. 16, 2008.

(30) Foreign Application Priority Data

Aug. 23, 2006  (JP) .................................. 2006-226561
Aug. 23, 2006  (JP) .................................. 2006-226562
May 22, 2007  (JP) .................................. 2007-134856

(51) Int. Cl.
*H01S 5/02* (2006.01)
*H01S 5/343* (2006.01)
*H01S 5/183* (2006.01)
*H01S 5/40* (2006.01)

(52) U.S. Cl.
USPC .................................. 372/50.124; 372/50.12

(58) Field of Classification Search
CPC ... H01S 5/0203; H01S 5/183; H01S 5/18313; H01S 5/18344; H01S 5/18377; H01S 5/32333; H01S 5/423; H01S 5/18358; H01S 5/3434
USPC ......................................... 372/50.124, 50.12
See application file for complete search history.

(56) References Cited

U.S. PATENT DOCUMENTS 5,166,945 A    11/1992    Arimoto
5,351,257 A     9/1994    Lebby et al.
(Continued)

FOREIGN PATENT DOCUMENTS

EP    1780849 A1    5/2007
JP    6-275918      9/1994
(Continued)

OTHER PUBLICATIONS

Ueki, Nobuaki et al., "Single-Transverse-Mode 3.4-mW Emission of Oxide-Confined 780-nm VCSEL's," *IEEE Photonics Technology Letters*, vol. 11, No. 12, Dec. 1999 pp. 1539-1541.

(Continued)

*Primary Examiner* — Jessica Stultz
*Assistant Examiner* — Michael Carter
(74) *Attorney, Agent, or Firm* — Cooper & Dunham LLP

(57) ABSTRACT

A surface-emitting laser array includes a plurality of surface-emitting laser elements. Each surface-emitting laser element includes a first reflection layer formed on a substrate, a resonator formed in contact with the first reflection layer and containing an active layer, and a second reflection layer formed over the first reflection layer and in contact with the resonator. The second reflection layer contains a selective oxidation layer. The first reflection layer contains on the active layer side at least a low refractive index layer having an oxidation rate equivalent to or larger than an oxidation rate of a selective oxidation layer contained in the second reflection layer. The resonator is made of an AlGaInPAs base material containing at least In. A bottom of a mesa structure is located under the selective oxidation layer and over the first reflection layer.

8 Claims, 37 Drawing Sheets

(56) References Cited

U.S. PATENT DOCUMENTS

| | | | |
|---|---|---|---|
| 5,493,577 | A | 2/1996 | Choquette et al. |
| 5,633,886 | A | 5/1997 | Ramdani et al. |
| 5,642,376 | A * | 6/1997 | Olbright et al. ............... 372/99 |
| 6,127,200 | A | 10/2000 | Ohiso et al. |
| 6,674,785 | B2 | 1/2004 | Sato et al. |
| 6,765,232 | B2 | 7/2004 | Takahashi et al. |
| 6,803,604 | B2 | 10/2004 | Takahashi et al. |
| 6,927,412 | B2 | 8/2005 | Takahashi et al. |
| 6,959,025 | B2 | 10/2005 | Jikutani et al. |
| 6,975,663 | B2 | 12/2005 | Sekiya et al. |
| 2002/0009258 | A1 * | 1/2002 | Coldren et al. ............... 385/24 |
| 2002/0074631 | A1 | 6/2002 | Sato et al. |
| 2002/0150137 | A1 | 10/2002 | Beam, III et al. |
| 2004/0114653 | A1 | 6/2004 | Omori |
| 2004/0144984 | A1 | 7/2004 | Knigge et al. |
| 2005/0169334 | A1 | 8/2005 | Sato |
| 2005/0230674 | A1 | 10/2005 | Takahashi et al. |
| 2005/0238075 | A1 | 10/2005 | Jikutani et al. |
| 2006/0007979 | A1 | 1/2006 | Jikutani et al. |
| 2006/0054899 | A1 | 3/2006 | Takahashi et al. |
| 2006/0072640 | A1 | 4/2006 | Johnson et al. |
| 2006/0134817 | A1 | 6/2006 | Sato et al. |
| 2006/0261352 | A1 | 11/2006 | Takahashi et al. |
| 2007/0263687 | A1 | 11/2007 | Takahashi et al. |

FOREIGN PATENT DOCUMENTS

| | | |
|---|---|---|
| JP | 9-18093 | 1/1997 |
| JP | 9-246652 | 9/1997 |
| JP | 10-125999 | 5/1998 |
| JP | 11-177183 | 7/1999 |
| JP | 2001-114656 | 4/2000 |
| JP | 2002-164621 | 6/2002 |
| JP | 2002-270959 | 9/2002 |
| JP | 2002-289976 | 10/2002 |
| JP | 2003-101140 | 4/2003 |
| JP | 2003-218466 | 7/2003 |
| JP | 2003-347670 | 12/2003 |
| JP | 2005-150442 | 6/2005 |
| JP | WO2005/122350 | 12/2005 |
| JP | 2006-196852 | 7/2006 |

OTHER PUBLICATIONS

Zorn, M. et al., "MOVPE process development for 650 nm VCSELS using optical in-situ techniques," *Journal of Crystal Growth*, North Holland Publishing, Amsterdam, NL, vol. 235, No. 1-4, Feb. 2002, pp. 25-34.

Ueki, N. et al., "VCSEL Array Applicable to Laser Printer," *Technical Report CS-3-4* (2004) from the Institute of Electronics, Information, and Communication Engineers (and English translation thereof).

Japanese official action dated Jul. 29, 2013 in connection with corresponding.

Japanese patent application No. 2013-100843.

* cited by examiner

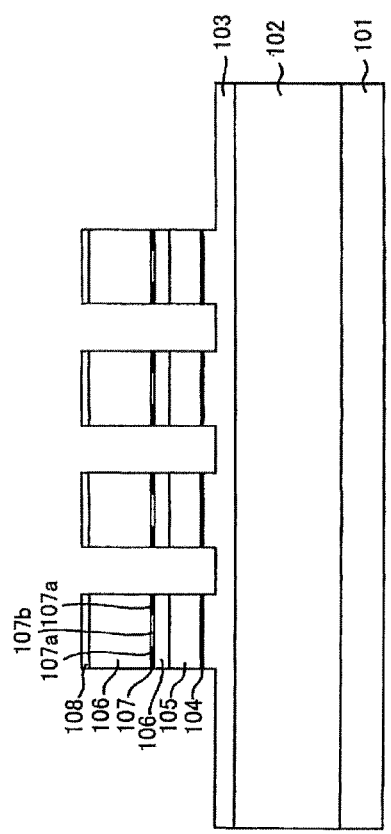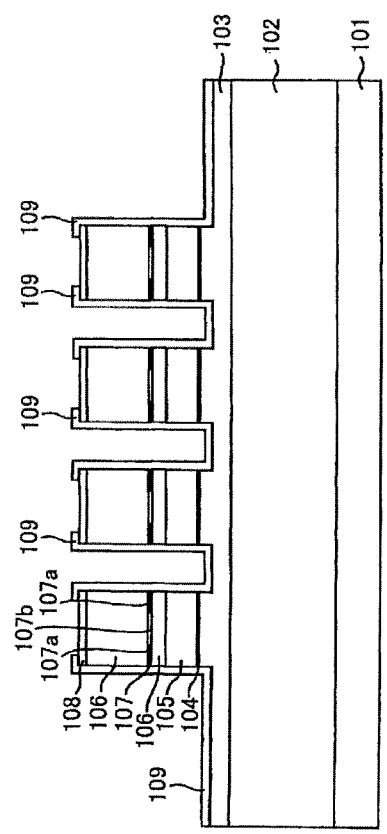

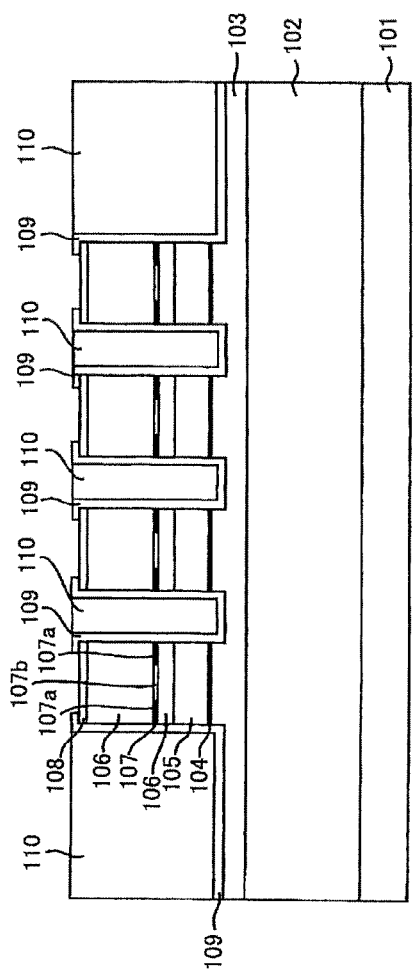

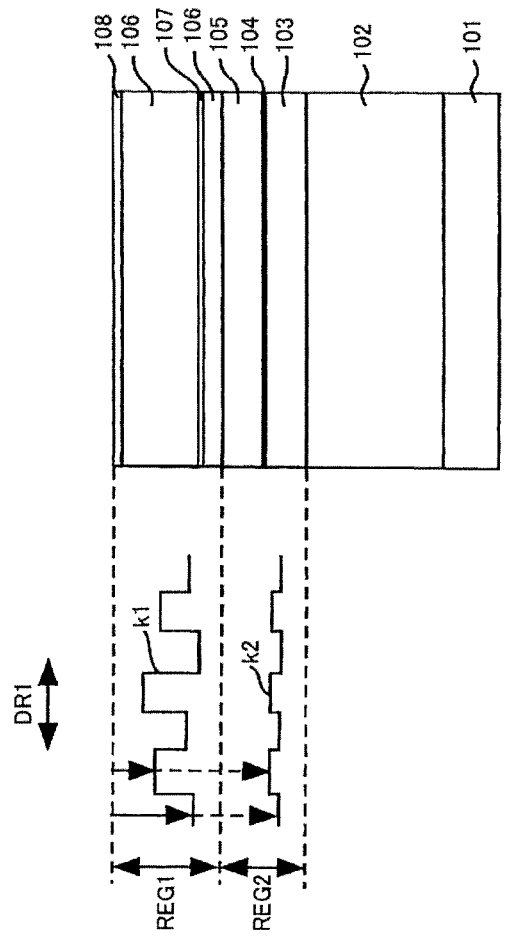

SURFACE-EMITTING LASER ARRAY, OPTICAL SCANNING DEVICE, AND IMAGE FORMING DEVICE

CROSS-REFERENCE TO RELATED APPLICATIONS

This patent application is a Rule 1.53(b) continuation of U.S. application Ser. No. 12/090,467, filed Apr. 16, 2008 as a Section 371 of PCT/JP2007/066508 filed Aug. 20, 2007, claiming priority to Japanese Patent Applications Nos. 2006-226561, 2006-226562 and 2007-134856 filed on Aug. 23, 2006, Aug. 23, 2006 and May 22, 2007 respectively, in the Japanese Patent Office.

TECHNICAL FIELD

This invention relates to a surface-emitting laser array, an optical scanning device including the surface-emitting laser array, and an image forming device including the surface-emitting laser array.

BACKGROUND ART

In a surface-emitting laser array in which surface-emitting laser elements are integrated, the output of each surface-emitting laser element during operation may decline due to a temperature rise through reception of heat from the surrounding surface-emitting laser elements, and the life of the surface-emitting laser array may be shortened.

To obviate the problem, it is necessary to improve the heat dissipation characteristic. For example, a material having a high thermal conductivity should be used for a semiconductor Bragg reflector which is located on the side of main heat dissipation. Among the materials which can be used for a semiconductor Bragg reflector of a surface-emitting laser element on a GaAs substrate, AlAs is a suitable one that has the highest thermal, conductivity.

However, there is a case in which etching into the shape of a mesa structure is performed in order to separate the surface-emitting laser element from the surrounding part electrically or spatially. In this case, although it is unnecessary that the etching reaches the lower semiconductor Bragg reflector arranged on the substrate side, the design is carried out, from the problem of the controllability of etching, by assuming that the etching bottom reaches the lower semiconductor Bragg reflector.

For example, in the case of an oxidization type surface-emitting laser element, it is necessary to etch more deeply than a selective oxidation layer in order to perform selective oxidation. For the purpose of stopping the divergence of the current, it is common to arrange the selective oxidation layer at a place near the active layer of the p-type semiconductor Bragg reflector (or the semiconductor Bragg reflector arranged above the active layer), or in the position of the first to fifth nodes (nodes in the field strength distribution of a laser beam) from the active layer.

However, from the problem of the controllability of the etching depth, it is difficult to control the etching bottom to be deeper than the selective oxidation layer but not to reach the lower semiconductor Bragg reflector.

In order to control the etching depth in the whole wafer surface, it is necessary to not only control the etching time but also attain the uniformity of etching in the wafer surface, and the uniformity of distribution of thickness of the crystal growth layer. Practically, it is very difficult to carry out mesa etching so as be deeper than the selective oxidation layer but not to reach the lower semiconductor Bragg reflector.

To resolve the problem, Japanese Laid-Open Patent Application No. 2002-164621 discloses separating the lower semiconductor Bragg reflector into two layers. In the laser array of Japanese Laid-Open Patent Application No. 2002-164621, the substrate side one of the two lower semiconductor Bragg reflector layers is a main refractive index layer which is made of AlAs. AlAs has a thermal conductivity which is much larger than that of AlGaAs. On the other hand, the active-layer-side reflector layer is made of AlGaAs which is used conventionally.

However, in the case of the surface-emitting laser array, carrying out uniform mesa etching within the surface of the wafer is still more difficult for other additional reasons. If the inter-element gap of the surface-emitting laser elements is narrowed in order to carry out array arrangement with high density, a difference $\Delta d$ between an etching depth of the inter-element gap and an etching depth of the flat part in the circumference of the surface-emitting laser array becomes large. Furthermore, a skirt portion arises in the etching configuration. It is desirable that the selective oxidation layer does not start from the skirt portion, in order to control the oxidization narrowing dimensions strictly.

However, if etching is performed so that the selective oxidation layer may not start from the skirt portion, the etching bottom in the flat part in the circumference of the surface-emitting laser array enters the lower semiconductor Bragg reflector.

Since the low refractive index layer of the lower semiconductor Bragg reflector usually is larger in thickness than the selective oxidation layer, if both the layers have the same composition, the oxidation rate of the low refractive index layer is quicker than that of the selective oxidation layer.

If the oxidation rate of the low refractive index layer of the lower semiconductor Bragg reflector is quicker than the selective oxidation layer, the whole low refractive index layer is oxidized early and performing the current pouring is impossible.

To avoid the problem, AlAs cannot be used as a material of the low refractive index layer which is located near the active layer of the lower semiconductor Bragg reflector. For this reason, in order to decrease the oxidation rate of the semiconductor Bragg reflector, it has been necessary to use AlGaAs in which a certain amount of Ga is added (for example, $Al_{0.9}Ga_{0.1}As$). Refer to the Technical Report CS-3-4 (2004) from the Institute of Electronics, Information and Communication Engineers, Electronics Society Convention, and IEEE PHOTONICS TECHNOLOGY LETTERS, VOL. 11, No. 12, 1999, pp. 1539-1541.

Japanese Laid-Open Patent Application No. 09-018093 discloses that etching of the upper semiconductor Bragg reflector is stopped up to a GaInP cladding layer (resonator region).

FIG. 37 is a plan view of a surface-emitting laser array according to the related art. As shown in FIG. 37, the double dummy elements are arranged in the circumference of the central array part where the surface-emitting laser elements are arranged.

Japanese Laid-Open Patent Application No. 2000-114656 discloses that the post (mesa) in the central array part and the post (mesa) in the circumference of the array part are subjected to a different environment and the posts (mesa) have a different configuration accordingly.

And Japanese Laid-Open Patent Application No. 2000-114656 discloses a surface-emitting laser array in which the double dummy elements arranged in the circumference of the central array part allows uniform characteristics.

In a conventional oxidization type surface-emitting laser array, the etching bottom in the flat part in the circumference of the surface-emitting laser array faces the lower semiconductor Bragg reflector. A material having a high thermal conductivity, such as AlAs, is easily oxidized if it appears on the surface by etching. AlAs cannot be used for the lower semiconductor Bragg reflector (at least in the region near the active layer).

Therefore, heat is easily accumulated in the active layer and the temperature of the active layer increases. There are the problems that the optical output declines and the life of the surface-emitting laser element becomes short. Especially, when the surface-emitting laser array operates, undesired influences due to thermal interference become remarkable. Operation of the surface-emitting laser array at high current values is impossible and use of the surface-emitting laser array with a low optical output is unavoidable. And the life of the surface-emitting laser array becomes short due to a temperature rise caused by thermal interference.

According to the teaching of Japanese Laid-Open Patent Application No. 2000-114656, in order to keep the etching bottom in the flat part in the circumference of the laser array from reaching the lower semiconductor Bragg reflector, the dummy elements may be arranged in the whole wafer to make small the difference Δd between the etching depth in the central array part and the etching depth in the flat part in the circumference of the array part.

If the flat part is not eliminated, the etching bottom reaches the lower semiconductor Bragg reflector so that AlAs is oxidized. Thus, it is necessary to arrange the dummy elements in the whole wafer.

However, if the dummy elements are arranged in the whole wafer, the area which is to be etched is decreased. This causes monitoring of oxidization (plasma emission spectrometry, optical reflective index analysis, etc.) to be difficult to perform. Moreover, if the dummy elements are arranged in the whole wafer, unevenness appears on the surface of the laser array and the probability of wire cut-off is raised. Furthermore, it is needed to form the wire bonding pads for implementation. However, if unevenness exists under the bottom of the bonding pads, the mesa structure may be damaged at the time of wire bonding, which causes a faulty surface-emitting laser array to be produced.

DISCLOSURE OF THE INVENTION

According to one aspect of the invention, there is provided an improved surface-emitting laser array in which the above-described problems are eliminated.

According to one aspect of the invention there is provided a surface-emitting laser array which is arranged without using dummy elements so that heat is not easily accumulated in the active layer.

According to one aspect of the invention there is provided an optical scanning device including a surface-emitting laser array which is arranged without using dummy elements so that heat is not easily accumulated in the active layer.

According to one aspect of the invention, there is provided an image forming device including a surface-emitting laser array which is arranged without using dummy elements so that heat is not easily accumulated in the active layer.

In an embodiment of the invention which solves or reduces one or more of the above-mentioned problems, there is provided a surface-emitting laser array including a plurality of surface-emitting laser elements, each of the plurality of surface-emitting laser elements comprising: a first reflection layer formed on a substrate to constitute a semiconductor Bragg reflector; a resonator formed in contact with the first reflection layer and containing an active layer; and a second reflection layer formed over the first reflection layer and in contact with the resonator to constitute the semiconductor Bragg reflector, the second reflection layer containing a selective oxidation layer therein, wherein the first reflection layer contains on the active layer side at least a low refractive index layer having an oxidation rate equivalent to or larger than an oxidation rate of a selective oxidation layer contained in the second reflection layer, the resonator is made of an AlGaInPAs base material containing at least In, and a bottom of a mesa structure in each surface-emitting laser element is located under the selective oxidation layer and over the first reflection layer.

The above-mentioned surface-emitting laser array may be configured so that the resonator has an etching rate smaller than an etching rate of the second reflection layer.

The above-mentioned surface-emitting laser array may be configured so that the second reflection layer containing on the active layer side a layer made of the AlGaInPAs base material containing at least In.

The above-mentioned surface-emitting laser array may be configured so that the bottom of the mesa structure is located inside the resonator or at an interface between the second reflection layer and the resonator.

The above-mentioned surface-emitting laser array may be configured so that the first reflection layer contains the low refractive index layer, which is made of AlAs, over an entire area of the surface-emitting laser element.

The above-mentioned surface-emitting laser array may be configured so that the selective oxidation layer contained in the second reflection layer constitutes a selective oxidation type current narrowing portion.

The above-mentioned surface-emitting laser array may be configured so that a difference between an etching depth in an inter-element gap of the plurality of surface-emitting laser elements and an etching depth of a peripheral portion of the plurality of surface-emitting laser elements is equal to or smaller than ½ of a beam-emission wavelength of each surface-emitting laser element.

The above-mentioned surface-emitting laser array may be configured so that the inter-element gap between two adjacent ones of the plurality of surface-emitting laser elements is set to a smaller one of a gap between top surface positions of two mesa structures in the plurality of surface-emitting laser elements and a gap between bottom surface positions of the two mesa structures, and is equal to or smaller than 20 micrometers.

The above-mentioned surface-emitting laser array may be configured so that a side of the first reflection layer is covered by a protection film.

The above-mentioned surface-emitting laser array may be configured so that the protection film is made of any of $SiO_2$, SiN and SiON.

The above-mentioned surface-emitting laser array may be configured so that a content of aluminum of the low refractive index layer arranged on the resonator side of the first reflection layer is larger than a content of aluminum of the selective oxidation layer.

The above-mentioned surface-emitting laser array may be configured so that a content of aluminum of a low refractive index layer arranged on the resonator side of the first reflection layer is the same as a content of aluminum of the selective oxidation layer, and a thickness of the low refractive index layer arranged on the resonator side of the first reflection layer is larger than a thickness of the selective oxidation layer.

In an embodiment of the invention which solves or reduces one or more of the above-mentioned problems, there is provided an optical scanning device comprising: the above-mentioned surface-emitting laser array; a deflection unit deflecting a plurality of laser beams emitted by the surface-emitting laser array, and a scanning optical element drawing the laser beams from the deflection unit on a scanned surface of a photoconductor.

In an embodiment of the invention which solves or reduces one or more of the above-mentioned problems, there is provided an image forming device in which the above-mentioned optical scanning device is provided.

In an embodiment of the invention which solves or reduces one or more of the above-mentioned problems, there is provided an image forming device in which the above-mentioned surface-emitting laser array is provided as a light source emitting a plurality of laser beams.

In an embodiment of the invention which solves or reduces one or more of the above-mentioned problems, there is provided a surface-emitting laser element having a mesa structure which emits a laser beam, the surface-emitting laser element comprising: a substrate; a first reflection layer formed on the substrate to constitute a semiconductor Bragg reflector; resonator formed in contact with the first reflection layer and containing an active layer; a second reflection layer formed in contact with the resonator to constitute the semiconductor Bragg reflector; and an absorption layer arranged to absorb a difference of an etching depth in an in-surface direction of the substrate when forming the mesa structure, wherein a bottom of the mesa structure is located in the absorption layer in a direction perpendicular to the substrate, and the absorption layer is formed in at least a part of the resonator in a thickness direction of the resonator.

The above-mentioned surface-emitting laser element may be configured so that the absorption layer is formed in an entire area of the resonator in a thickness direction of the resonator.

The above-mentioned surface-emitting laser element may be configured so that the absorption layer is formed in an entire area of the resonator in a thickness direction of the resonator and formed partially in a thickness direction of the second reflection layer.

The above-mentioned surface-emitting laser element may be configured so that the absorption layer contains at least In.

In an embodiment of the invention which solves or reduces one or more of the above-mentioned problems, there is provided a method of manufacturing a surface-emitting laser array, the surface-emitting laser array including: an element-arrangement portion provided on a substrate and having a plurality of surface-emitting laser elements arranged; and a flat part provided on the substrate and arranged in a circumference of the element-arrangement portion in an in-surface direction of the substrate, each of the plurality of surface-emitting laser elements including a mesa structure which emits a laser beam, and the flat part and the element-arrangement portion including an absorption layer arranged to absorb a difference of an etching depth in the in-surface direction when forming the mesa structure, the method comprising the steps of: forming a multilayer semiconductor film on the substrate; and etching the multilayer semiconductor film to cause a bottom of the mesa structure to be located in the absorption layer, so that the element-arrangement portion and the flat part are formed.

According to embodiments of the surface-emitting laser array of the invention, it is possible to. In each of the surface-emitting laser elements, which constitute the surface-emitting laser array, the resonator is made of the material containing at least In, the bottom of the mesa structure is arranged so that the second reflection layer is nearer to the bottom of the mesa structure than the first reflection layer, and the first reflection layer contains on the active layer side at least a low refractive index layer having an oxidation rate equivalent to or larger than an oxidation rate of the selective oxidation layer.

And in the process of forming the mesa structure, the difference between the etching depth in the array region where the surface-emitting laser elements are arranged and the etching depth in the circumference of the array region is reduced to prevent exposure of the first reflection layer in the circumference of the array region and prevent oxidization of the first reflection layer. As a result, heat generated in the active layer radiates easily to the substrate side via the first reflection layer. Therefore, according to the invention, it is possible to arrange the surface-emitting laser array without using dummy elements so that heat is not easily accumulated in the active layer.

BRIEF DESCRIPTION OF THE DRAWINGS

Other objects, features and advantages of the present invention will be apparent from the following detailed description when reading in conjunction with the accompanying drawings.

FIG. 5A, FIG. 5B, and FIG. 5C are diagram for explaining the method of manufacturing the surface-emitting laser array of FIG. 1.

FIG. 7 is a diagram for explaining etching in the process of FIG. 4B.

FIG. 21A, FIG. 216, FIG. 21C, and FIG. 21D are diagrams for explaining a method of manufacturing a surface-emitting laser array in an embodiment of the invention.

BEST MODE FOR CARRYING OUT THE INVENTION

A description will be given of embodiments of the invention with reference to the accompanying drawings.

Figure 1:
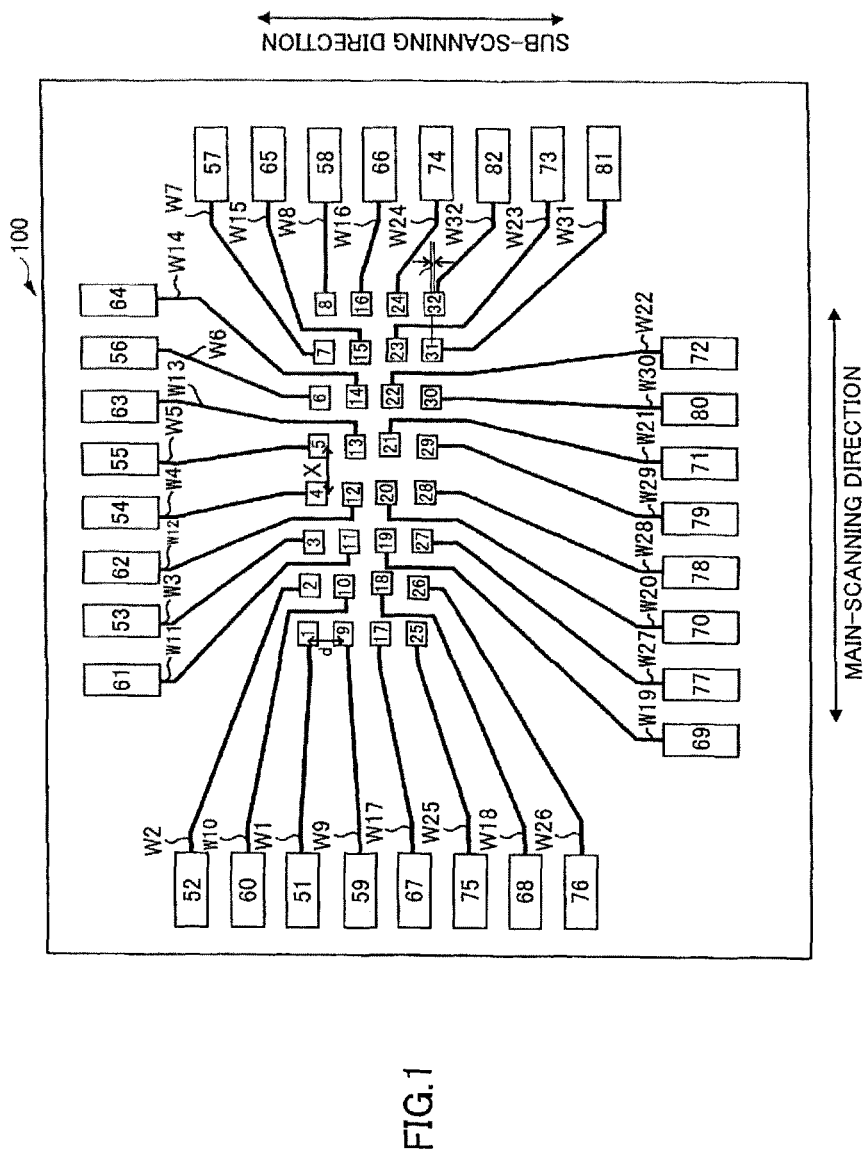
FIG. 1 is a plan view of a surface-emitting laser array in an embodiment of the invention.

FIG. 1 is a plan view of a surface-emitting laser array in an embodiment of the invention. As shown in FIG. 1, the surface-emitting laser array 100 of this embodiment includes surface-emitting laser elements 1-32, pads 51-82, and wires W1-W32.

The surface-emitting laser elements 1-32 are arranged in the two-dimensional formation of four rows×eight columns. Each of the surface-emitting laser elements 1-32 has the rectangle form whose one side is 16 micrometers.

And the columns of four surface-emitting laser elements 1,9,17,25/2,10,18,26/3,11,19,27/4,12,20,28/5,13,21,29/6, 14,22,30/7,15,23,31/8,16,24,32 are arranged in the sub-scanning direction. And the rows of eight surface-emitting laser elements 1-8/9-16/17-24/25-32 are arranged in the main scanning direction.

The rows of the eight surface-emitting laser elements 1-8/9-16/17-24/25-32 arranged in the main scanning direction are shifted in a step-wise manner in the sub-scanning direction, and they are arranged so that 32 laser beams emitted from the 32 surface-emitting laser elements 1-32 do not overlap mutually. In the eight surface-emitting laser elements 1-8/9-16/17-24/25-32 arranged in the main scanning direction, the gap between two adjoining surface-emitting laser elements is set to an interval X. In the four surface-emitting laser elements 1,9,17,25/2,10,18,26/3,11,19,27/4,12,20,28/5,13,21,29/6, 14,22,30/7,15,23,31/8,16,24,32 arranged in the sub-scanning direction, the gap between two adjoining surface-emitting laser elements is set to an interval d. The interval d is smaller than the interval X.

For example, the interval d is equal to 24 micrometers and the interval X is equal to 30 micrometers.

Eight normals taken from the centers of the eight surface-emitting laser elements 1-8 arranged in the main scanning direction, to the straight line parallel to the sub-scanning direction are arranged in the sub-scanning direction at equal intervals of c1, which is determined by the condition c1=d/8. Namely, when the interval d is set to 24 micrometers, the interval c1 is equal to 24/8=3 micrometers.

The eight normals taken from the respective centers of the other eight surface-emitting laser elements 9-16/17-24/25-32 arranged in the main scanning direction, to the straight line parallel to in the sub-scanning direction are also arranged in the sub-scanning direction at equal intervals of c1.

The pads 51-82 are arranged around the circumference of the surface-emitting laser elements 1-32 in two-dimensional formation. The wires W1-W32 are arranged to connect the surface-emitting laser elements 1-32 to the pads 51-82, respectively. And each of the wires W1-W32 has a line width of 8 micrometers, for example.

The wires W1-W9, W16, W17, W24-W32 which connect the surface-emitting laser elements 1-8, 9, 16, 17, 24-32 arranged in the outermost circumference among the surface-emitting laser elements 1-32 arranged in two dimensional formation, to the pads 51-59, 66, 67, 74, 75-82 respectively are arranged without passing by between two adjoining surface-emitting laser elements in the main scanning direction.

The wires W10-W15, W18-W23 which connect the surface-emitting laser elements 10-15, 18-23 arranged in the inside position among the surface-emitting laser elements 1-32 arranged in two dimensional formation, to the pads 60-65, 68-73 respectively are arranged so that they pass by between two adjoining surface-emitting laser elements in the main scanning direction.

In the eight surface-emitting laser elements 1-8/9-16/17-24/25-32 arranged in the main scanning direction, the gap between two adjoining surface-emitting laser elements is set to the interval X (=30 micrometers) mentioned above. Each of the surface-emitting laser elements 1-32 has a rectangular form one side of which is equal to 16 micrometers. The interval between two adjoining surface-emitting laser elements in the main scanning direction is equal to 14 (=30−16) micrometers. The wires W10-W15, W18-W23 the line width of which is 8 micrometers can be arranged between two adjoining surface-emitting laser elements in the main scanning direction.

Figure 2:
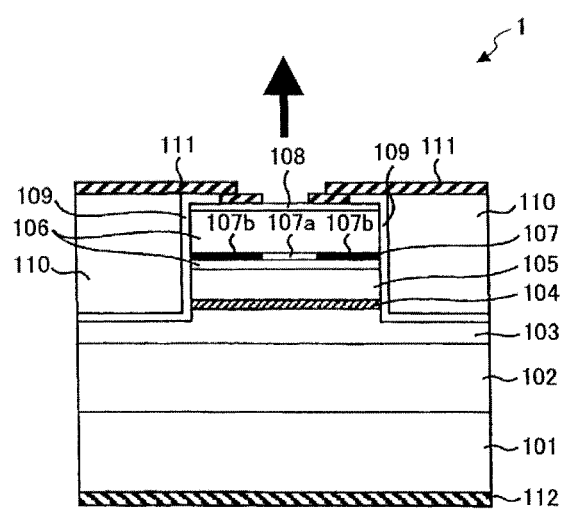
FIG. 2 is a cross-sectional view of a surface-emitting laser element in the surface-emitting laser array of FIG. 1.

FIG. 2 is a cross-sectional view of a surface-emitting laser element 1 in the surface-emitting laser array of FIG. 1. As shown in FIG. 2, the surface-emitting laser element 1 includes substrate 101, reflection layers 102,106, resonator spacer layers 103,105, active layer 104, selective oxidation layer 107, contact layer 108, $SiO_2$ layer 109, insulating resin 110, p-type electrode 111, and n-type electrode 112.

The surface-emitting laser element 1 is a surface-emitting laser which emits a laser beam having a wavelength of 780 nm. The substrate 101 is constituted by n-type gallium arsenide (n-GaAs).

The reflection layer 102 is constituted by 40.5 cycles of n-AlAs/n-$Al_{0.3}Ga_{0.7}$As where one cycle is a pair of n-AlAs layer and n-$Al_{0.3}Ga_{0.7}$As layer, and formed on the substrate 101.

And each thickness of n-AlAs and n-Al0.3Ga0.7As is set to $\lambda/4n$ (where n is a refractive index of each semiconductor layer), when the emission wavelength of the surface-emitting laser element 1 is set to $\lambda$.

The resonator spacer layer 103 is constituted by non-doped $(Al_{0.7}Ga_{0.3})_{0.5}In_{0.5}P$ and formed on the reflection layer 102. The active layer 104 has the quantum well structure containing the well layer constituted by GaInPAs and the barrier layer constituted by $Ga_{0.6}In_{0.4}P$, and formed on the resonator spacer layer 103.

The resonator spacer layer 105 is constituted by non-doped $(Al_{0.7}Ga_{0.3})_{0.5}In_{0.5}P$, and formed on the active layer 104. Assuming that a pair of p-$Al_{0.9}Ga_{0.1}$As/$Al_{0.3}Ga_{0.7}$As is one cycle, the reflection layer 106 is constituted by 24 cycles of p-$Al_{0.9}Ga_{0.1}$As/$Al_{0.3}Ga_{0.7}$As, and formed on the resonator spacer layer 105.

And the thickness of each of p-$Al_{0.9}Ga_{0.1}$As and $Al_{0.3}Ga_{0.7}$As is set to $\lambda/4n$ (where n is a refractive index of each semiconductor layer). The selective oxidation layer 107 is constituted by p-AlAs and formed in the reflection layer 106.

More specifically, the selective oxidation layer 107 is formed in the position of $7\lambda/4$ from the resonator spacer layer 105. And the selective oxidation layer 107 includes non-oxidizing region 107a and oxidization region 107b and has a thickness of 20 nm.

The contact layer 108 is constituted by p-GaAs and formed on the reflection layer 106.

The $SiO_2$ layer 109 is formed to cover one principal plane of the part of resonator spacer layer 103 and the end faces of the active layer 104, the resonator spacer layer 105, the reflection layer 106, the selective oxidation layer 107, and the contact layer 108.

The insulating resin 110 is formed in contact with the $SiO_2$ layer 109. The p-type electrode 111 is formed on the part of contact layer 108 and the insulating resin 110. The n-type electrode 112 is formed on the back of the substrate 101.

Each of the reflection layer 102, 106 constitutes the semiconductor distributed Bragg reflector which reflects the emission light emitted from the active layer 104 through Bragg's multipath reflection and includes the emission light in the active layer 104.

The oxidization region 107b has a refractive index which is smaller than that of the non-oxidizing region 107a. And the oxidization region 107b confines in non-oxidizing region 107a the emission light oscillated by active layer 104 while the current poured in from p-type electrode 111 constitutes the current narrowed area which restricts the course which flows into active layer 104 to non-oxidizing region 107a.

In this manner, the emission of the surface-emitting laser element 1 with a low threshold current is attained. Thus, the current narrowing area is produced by performing selective oxidation of the oxidization region 107b of selective oxidation layer 107. Therefore, the current narrowing area is a selective oxidation type.

Figure 3:
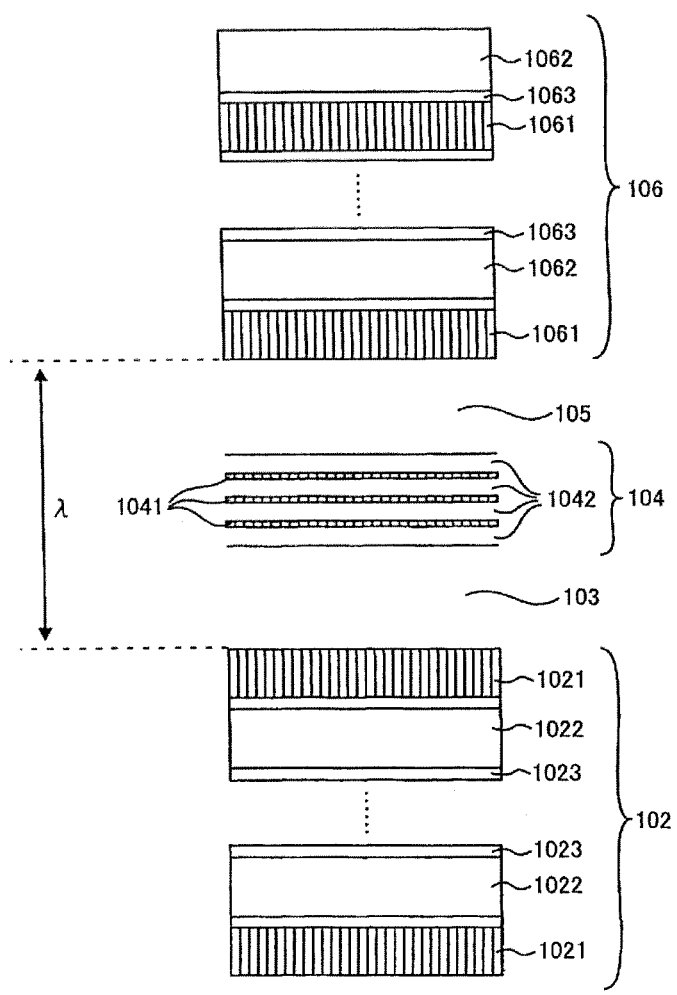
FIG. 3 is a cross-sectional view showing the neighborhood of an active layer of the surface-emitting laser element of FIG. 2.

FIG. 3 is a cross-sectional view showing the neighborhood of the active layer 104 of the surface-emitting laser element 1 of FIG. 2. As shown in FIG. 3, the reflection layer 102 includes low refractive index layer 1021, high refractive index layer 1022, and composition inclination layer 1023.

The low refractive index layer 1021 is constituted by n-AlAs, and the high refractive index layer 1022 is constituted by n-$Al_{0.3}Ga_{0.7}$As.

The composition inclination layer 1023 is constituted by n-AlGaAs in which the content of Al changes gradually toward another side from the low refractive index layer 1021 or the high refractive index layer 1022.

And the low refractive index layer 1021 touches the resonator spacer layer 103. The reflective layer 106 includes low refractive index layer 1061, high refractive index layer 1062, and composition inclination layer 1063.

The low refractive index layer 1061 is constituted by p-$Al_{0.9}Ga_{0.1}$As, and the high refractive index layer 1062 is constituted by p-$Al_{0.3}Ga_{0.7}$As. The composition inclination layer 1063 is constituted by p-AlGaAs in which the content of Al changes gradually toward another side from the low refractive index layer 1061 or the high refractive index layer 1062.

And the low refractive index layer 1061 touches the resonator spacer layer 105. The active layer 104 is constituted by the quantum well structure where three well layers 1041 each of which is constituted by GaInPAs, and four barrier layers 1042 each of which is constituted by $Ga_{0.6}In_{0.4}P$ are laminated alternately.

And the barrier layer 1042 touches the resonator spacer layer 103,105. GaInPAs which constitutes the well layer 1041 has a compressive strain, and $Ga_{0.6}In_{0.4}P$ which constitutes the barrier layer 1042 has a tensile strain.

In the surface-emitting laser element 1, the resonator spacer layer 103,105 and the active layer 104 constitute a resonator, and the thickness of the resonator in a direction perpendicular to the substrate 101 is set to one wavelength ($=\lambda$) of the surface-emitting laser element 1. That is, the resonator spacer layer 103,105 and the active layer 104 constitute a one-wave resonator.

Each of the surface-emitting laser elements 2-32 shown in FIG. 1 is constituted to have the composition which is the same as the composition of the surface-emitting laser element 1 of FIG. 2 and FIG. 3.

FIGS. 4A-4C, FIGS. 5A-5C, and FIGS. 6A and 6B are diagrams for explaining the method of manufacturing the surface-emitting laser array 100 of FIG. 1. In FIGS. 4A-6B, the manufacturing process in the case of producing four surface-emitting laser elements 1, 9, 17, and 25 among 32 surface-emitting laser elements 1-32 in the surface-emitting laser array 100 of FIG. 1 will be explained as an example of the method of manufacturing the surface-emitting laser array 100.

Figure 4A:
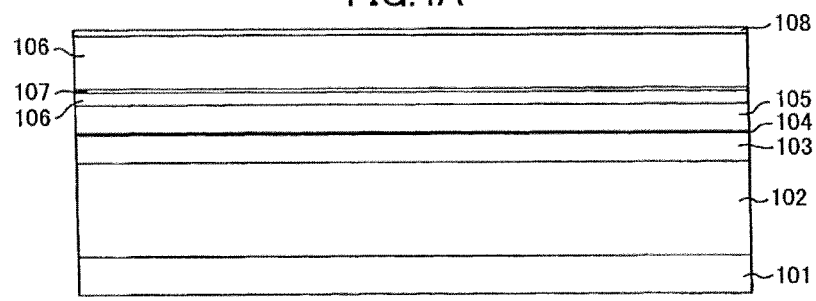
FIG. 4A, FIG. 4B, and FIG. 4C are diagrams for explaining a method of manufacturing the surface-emitting laser array of FIG. 1.

In FIG. 4A, upon start of this manufacturing process, the metal-organic chemical vapor deposition (MOCVD) process is performed. Reflective layer 102, resonator spacer layer 103, active layer 104, resonator spacer layer 105, reflection layer 106, selective oxidation layer 107, and contact layer 108 are laminated one by one on substrate 101 (refer to FIG. 4A).

In this case, n-AlAs and n-$Al_{0.3}Ga_{0.7}As$ of the reflection layer 102 are formed by using trimethyl aluminum (TMA), trimethyl gallium (TMG), arsine ($AsH_3$), and hydrogen selenide ($H_2Se$) as source materials. $(Al_{0.7}Ga_{0.3})_{0.5}In_{0.5}P$ of the resonator spacer layer 103 is formed by using trimethyl aluminum (TMA), trimethyl gallium (TMG), trimethyl indium (TMI), and phosphine ($PH_3$) as source materials.

And GaInPAs of the active layer 104 is formed by using trimethyl gallium (TMG), trimethyl indium (TMI), phosphine ($PH_3$), and arsine (AsH3) as source materials. $Ga_{0.6}In_{0.4}P$ of the active layer 104 is formed by using trimethyl gallium (TMG), trimethyl indium (TMI), and phosphine (PH3) as source materials.

And $(Al_{0.7}Ga_{0.3})_{0.5}In_{0.5}P$ of the resonator spacer layer 105 is formed by using trimethyl aluminum (TMA), trimethyl gallium (TMG), trimethyl indium (TMI), and phosphine (PH3) as source materials. $p-Al_{0.9}Ga_{0.1}As/p-Al_{0.3}Ga_{0.7}As$ of the reflection layer 106 is formed by using trimethyl aluminum (TMA), trimethyl gallium (TMG), arsine (AsH3), and carbon tetrabromide ($CBr_4$) as source materials. Instead of carbon tetrabromide ($CBr_4$), dimethyl zinc (DMZn) may be used.

And p-AlAs of the selective oxidation layer 107 is formed by using trimethyl aluminum (TMA), arsine ($AsH_3$) and carbon tetrabromide ($CBr_4$) as source materials. p-GaAs of the contact layer 108 is formed by using trimethyl gallium (TMG), arsine ($AsH_3$) and carbon tetrabromide ($CBr_4$) as source materials. Also in this case, instead of carbon tetrabromide (CBr4), dimethyl zinc (DMZn) may be used.

Figure 4B:
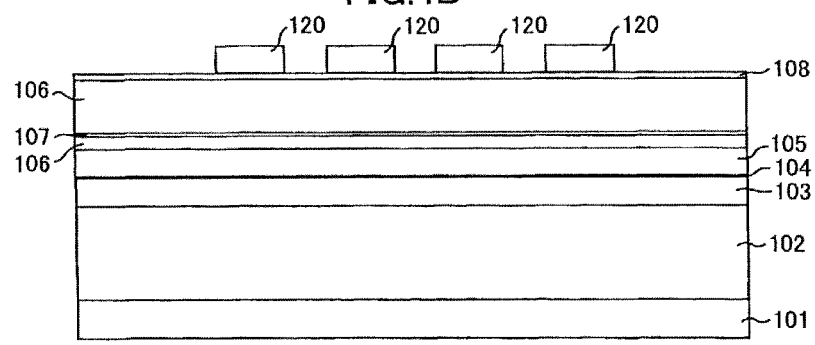

Then, resist is applied to the contact layer 108 and a resist pattern 120 is formed on the contact layer 108 using photoengraving process technology (refer to FIG. 4B).

If the resist pattern 120 is formed, the formed resist pattern 120 is used as a mask. Dry etching of the part of the resonator spacer layer 103, the active layer 104, the resonator spacer layer 105, the reflection layer 106, the selective oxidation layer 107, and the contact layer 108 is carried out, and the resist pattern 120 is removed further.

In this case, the part of resonator spacer layer 103, the active layer 104, the resonator spacer layer 105, the reflection layer 106, the selective oxidation layer 107, and the contact layer 108 are subjected to a halogen base gas of $Cl_2$, $BCl_3$, $SiCl_4$, $CCl_4$, or $CF_4$ introduced thereto. Etching is performed by using the dry etching method using plasma, such as the reactive ion beam etching (RIBE) method, the inductively-coupled-plasma (ICP) etching method, and the reactive ion etching (RIE) method.

And during etching of the part of resonator spacer layer 103, the active layer 104, the resonator spacer layer 105, the reflection layer 106, the selective oxidation layer 107, and the contact layer 108, a plasma emission spectrum analysis is performed from the window of the etching system, and a time change with the emission intensity of 451 nm of In is monitored.

Since emission of In can be detected only when the region of the resonator is etched, etching can be easily stopped in the resonator region which is constituted by a AlGaInPAs base material.

Figure 4C:
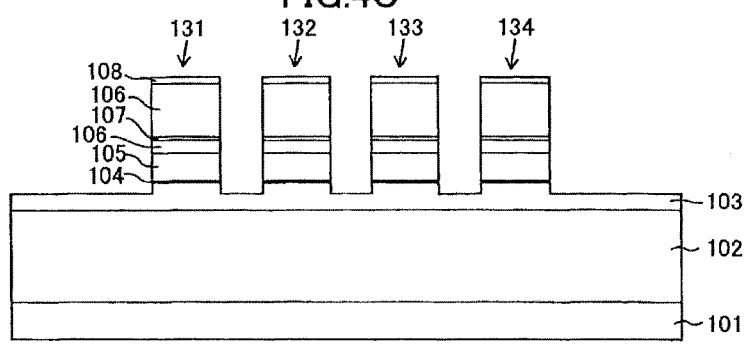

As a result, mesa structures 131-134 in the surface-emitting laser elements 1, 9, 17, and 25 are formed (refer to FIG. 4C).

Each of the mesa structures 131-134 is constituted by the part of resonator spacer layer 103, the active layer 104, the resonator spacer layer 105, the reflection layer 106, the selective oxidation layer 107, and the contact layer 108.

Alternatively, the part of resonator spacer layer 103, the active layer 104, the resonator spacer layer 105, the reflection layer 106, the selective oxidation layer 107, and the contact layer 108 may be etched by wet etching. When selective etching of the reflection layer 106, the selective oxidation layer 107, and the contact layer 108, which are constituted by a AlGaAs material, is performed by wet etching, a sulfuric-acid base etchant may be used.

Next, as shown in FIGS. 5A-5C, after the process of FIG. 4C is completed, in the atmosphere in which bubbling of water heated at 85 degrees C. is performed with nitrogen gas, a sample is heated at 350 degrees C. and the circumference of the selective oxidation layer 107 is oxidized in the direction from the peripheral part to the central part, so that non-oxidizing region 107a and oxidization region 107b are formed in the selective oxidation layer 107 (refer to FIG. 5A).

Then, the $SiO_2$ layer 109 is formed all over the sample using the chemical vapor depositing (CVD) method, and the region which serves as a light emitting part and the $SiO_2$ layer 109 in its adjacent areas are removed using the electrophotographic process (refer to FIG. 5B).

Next, the insulating resin 110 is applied to the whole sample by the spin coat, and the insulating resin 110 in the region used as the light emitting part is removed (FIG. 5C).

Figure 6A:
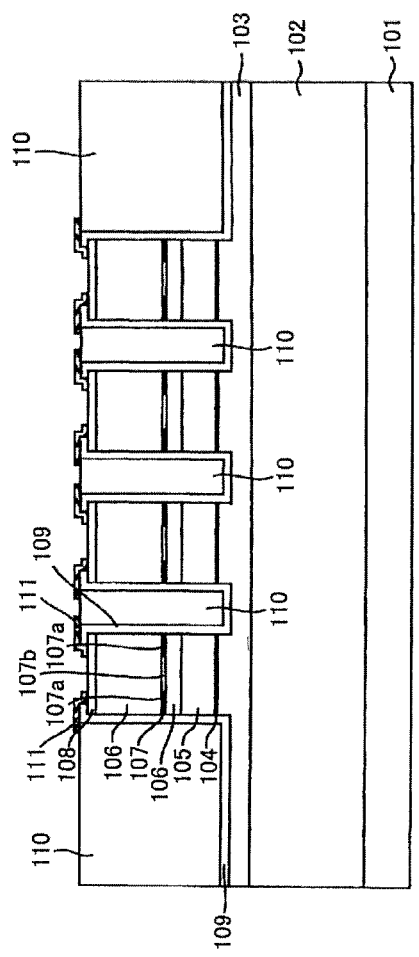
FIG. 6A and FIG. 6B are diagrams for explaining the method of manufacturing the surface-emitting laser array of FIG. 1.
Figure 6B:
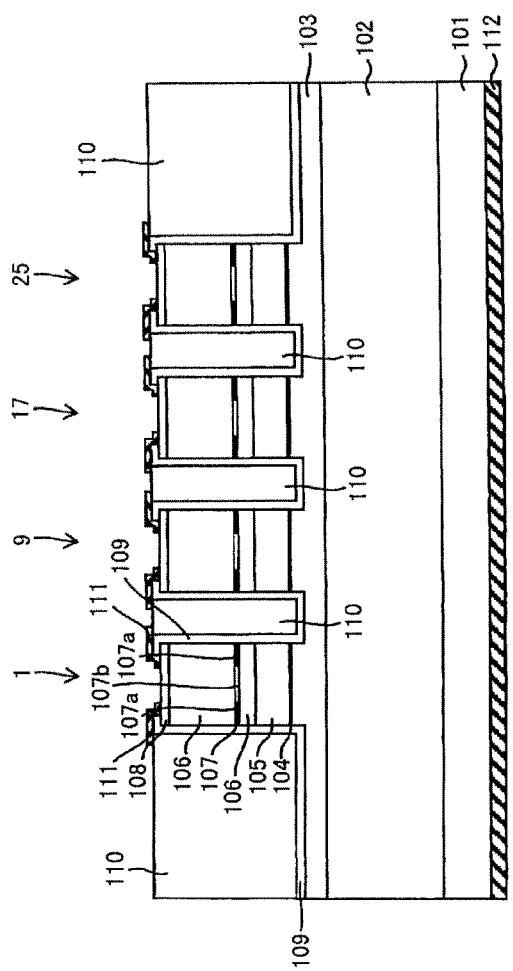

Next, as shown in FIG. 6A and FIG. 6B, after the insulating resin 110 is formed, the resist pattern which has a predetermined size is formed in the region used as the light emitting part, a p-type electrode material is formed all over the sample by the vapor deposition method, the p-type electrode material on the resist pattern is removed by the lift-off method, and the p-type electrode 111 is formed (refer to FIG. 6A).

And the back of the substrate 101 is ground, a n-type electrode 112 is formed on the back of the substrate 101 and further annealed to create the ohmic conduction of the p-type electrode 111 and the n-type electrode 112 (refer to FIG. 6B). In this manner, the surface-emitting laser array 100 is produced.

In the processes of FIG. 4B and FIG. 4C, the dry etching for forming the four surface-emitting laser elements is illustrated. However, in practice, the dry etching for forming 32 surface-emitting laser elements 1-32 of FIG. 1 simultaneously is performed in the processes of FIG. 4B and FIG. 4C.

In this case, the resist pattern for forming simultaneously 32 surface-emitting laser elements 1-32 is formed using the photomask which is in conformity with the arrangement of 32 surface-emitting laser elements 1-32 of FIG. 1. Namely, the resist pattern for forming simultaneously 32 surface-emitting laser elements 1-32 is arranged so that the intervals X and d are set up to meet the condition d<X, and eight normals to straight lines arranged in the sub-scanning direction from the eight centers of the eight surface-emitting laser elements 1-3/9-16/17-24/25-32 arrayed in the main scanning direction are arranged at equal intervals of c1.

In the surface-emitting laser array 100, the interval d of the surface-emitting laser elements arranged in the sub-scanning direction is set up to be smaller than the interval X of the surface-emitting laser elements arranged in the main scanning direction. Thereby, when compared to the case where the interval d is made larger than the interval X, the interval c1 (=d/8) can be made small and this is advantageous to high density recording.

It is also possible to narrow both the interval of the surface-emitting laser elements arranged in the sub-scanning direction and the interval of the surface-emitting laser elements arranged in the main scanning direction. However, it is necessary to extend at least one interval in order to secure a space required for wiring of the elements and reduction of the influence of the thermal interference between the elements. Thus, in order to perform high-density writing, it is preferred to extend the interval in the main scanning direction.

FIG. 7 is a diagram for explaining etching in the process of FIG. 43. FIG. 7 shows a distribution of etching depth in an in-surface direction DR1 of the substrate 101 when etching of the crystal layer constituted by any of the resonator spacer layer 103, the active layer 104, the resonator spacer layer 105, the reflection layer 106, the selective oxidation layer 107, and the contact layer 108 is performed without using the resist pattern 120.

As shown in FIG. 7, a distribution of etching depth in the in-surface direction DR1 of the substrate 101 when etching of the contact layer 108, the selective oxidation layer 107, and the reflection layer 106 (called region REG1) is represented by the curve k1. On the other hand, a distribution of etching depth in the in-surface direction DR1 of the substrate 101 when etching of the resonator spacer layer 105, the active layer 104, and the resonator spacer layer 103 (called region REG2) is represented by the curve k2.

Since the reflection layer 106, the selective oxidation layer 107, and the contact layer 106 are constituted by an AlGaAs base material as mentioned above, the etching rate is relatively large and the distribution of etching depth of the region REG1 in the in-surface direction DR1 is relatively large (see the curve k1).

On the other hand, since the resonator spacer layer 103,105 and the active layer 104 contain In and the vapor pressure of the reactant of In is low, the etching rate of the resonator spacer layer 103,105 and the active layer 104 is smaller than the etching rate of the reflection layer 106, the selective oxidation layer 107, and the contact layer 108. Thus, the distribution of etching depth of the region REG2 in the in-surface direction DR1 is smaller than the distribution of in-surface direction DR1 of etching depth of the region REG1 (see the curve k2).

Namely, a difference of etching depth produced in the region REG1 in the in-surface direction DR1 is absorbed by lowering of the etching rate in the region REG2. As a result, the distribution of etching depth of the region REG2 in the in-surface direction DR1 is smaller than the distribution of etching depth of the region REG1 in the in-surface direction DR1.

Next, an experimental result which shows that the etching rate of the region REG2 containing In is smaller than the etching rate of the region REG1 constituted by an AlGaAs base material will be explained.

Figure 8:
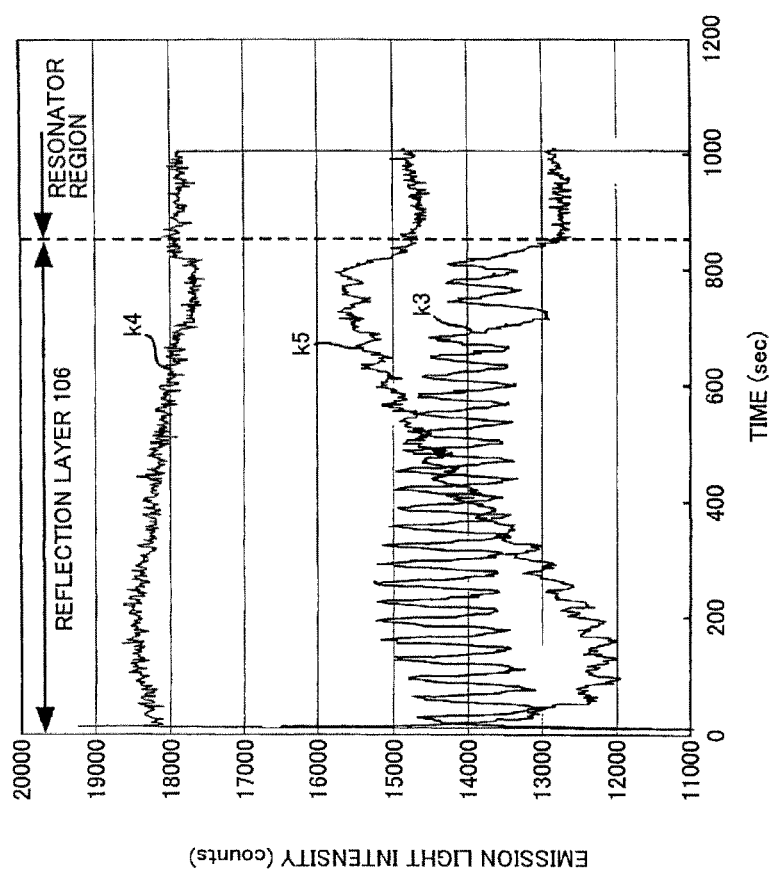
FIG. 8 is a timing chart for explaining a plasma emission at the time of etching when producing the surface-emitting laser array of FIG. 1.
Figure 9:
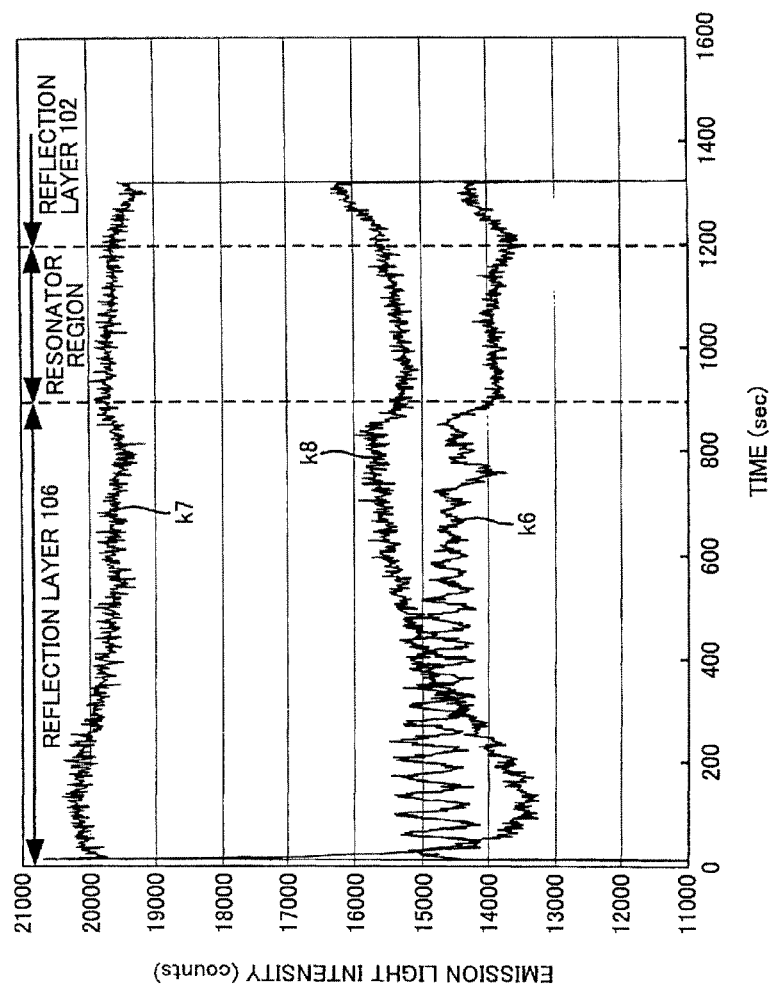
FIG. 9 is a timing chart for explaining a plasma emission at the time of etching when producing the surface-emitting laser array of FIG. 1.

FIG. 8 and FIG. 9 are first and second timing charts for explaining the plasma emission at the time of etching when producing the surface-emitting laser array 100 of FIG. 1, respectively.

In FIG. 8 and FIG. 9, the vertical axis expresses the intensity of plasma emission light and the horizontal axis expresses the time. FIG. 8 shows the case where etching is performed to the middle of the resonator region, and FIG. 9 shows the case where etching is performed from the resonator region to the third cycle one of the reflection layer 102.

In FIG. 8, the curve k3 shows the emission intensity of gallium (Ga), the curve k4 shows the emission intensity of indium (In), and the curve k5 shows the emission intensity of aluminum (aluminum).

In FIG. 9, the curve k6 shows the emission intensity of Ga, the curve k7 shows the emission intensity of In, and the curve k8 shows the emission intensity of aluminum.

In the experiment, a sample in which the thickness from the surface to the interface between the reflection layer 106 and the resonator region is 3.18 micrometers, and the thickness of the resonator region containing In is 0.23 micrometer is used.

The etching rate in the region from the surface to the interface between the reflection layer 106 and the resonator region is 3.18 micrometers/871 seconds=$3.65 \times 10^{-3}$ micrometers/sec. On the other hand, the etching rate in the resonator region is 0.23 micrometers/372 seconds=$6.18 \times 10^{-4}$ micrometers/sec (refer to FIG. 9).

As described above, in the resonator region containing In, the etching rate fails. Although the thickness (=0.23 micrometers) of the resonator region is smaller than the thickness (=3.18 micrometers) of the region above the resonator region, the resonator region requires a longer time for etching.

The emission intensity of In increases in the resonator region (see the curves k4 and k7) Therefore, etching can be easily stopped in the resonator region by detecting an increase of the emission intensity of In.

The emission intensity of Ga and the emission intensity of Al changes periodically with progress of the etching time, and the amplitude of the emission intensity decreases gradually with progress of the etching time (see the curves k3, k5, k6, and k8).

If the distribution of etching depth of the wafer in the in-surface direction DR1 is uniform, the emission intensity of Ga and the emission intensity of aluminum change periodically with a constant amplitude.

On the other hand, if the distribution of etching depth of the wafer in the in-surface direction DR1 is not uniform, the emission of Al and the emission of Ga are observed simultaneously so that the amplitude of the emission intensity of Ga and the amplitude of the emission intensity of Al become small.

Therefore, the gradual decrease of the amplitude of the emission intensity of Ga and the amplitude of the emission intensity of Al with progress of the etching time means that a difference of the etching depth arises in the in-surface direction DR1 of the wafer with progress of the etching time.

And after etching is performed through the resonator region, the amplitude of the emission intensity of Ga and the amplitude of the emission intensity of Al decrease further. When the etching bottom reaches the reflection layer 102, a larger difference of the etching depth in the in-surface direction DR1 arises (see the curves k6 and k8).

Figure 10:
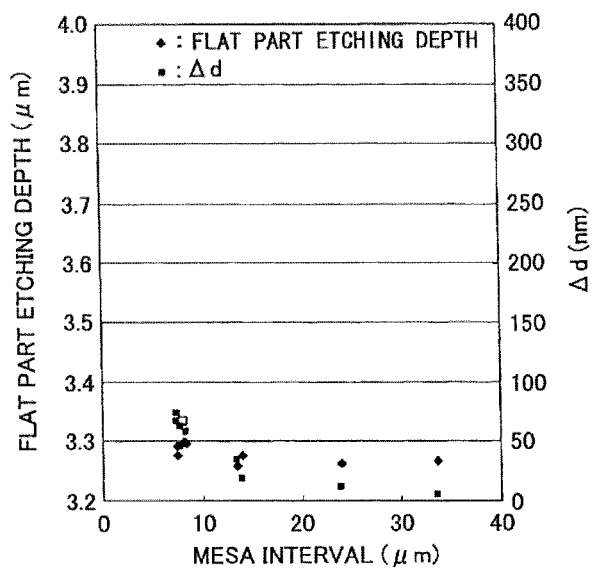
FIG. 10 is a diagram for explaining an etching depth in the flat part at the time of stopping etching in the resonator region, and a difference between an etching depth in the inter-element gap of the surface-emitting laser elements and an etching depth in the flat part with respect to a mesa interval.

FIG. 10 is a diagram for explaining an etching depth in the flat part at the time of stopping etching in the resonator region and a difference between an etching depth in the inter-element gap of the surface-emitting laser elements and an etching depth in the flat part with respect to a mesa interval.

Figure 11:
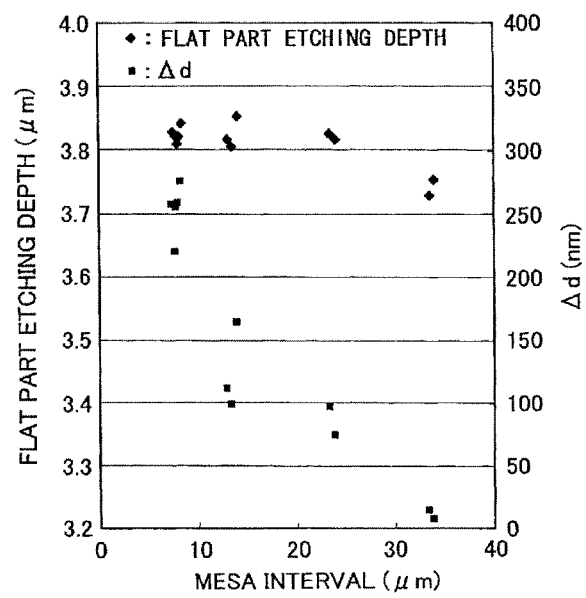
FIG. 11 is a diagram for explaining an etching depth in the flat part at the time of stopping etching in the reflection layer arranged on the substrate side, and a difference between an etching depth in the inter-element gap of the surface-emitting laser elements and an etching depth in the flat part with respect to a mesa interval.

FIG. 11 is a diagram for explaining an etching depth in the flat part at the time of stopping etching in the reflection layer 102 arranged on the substrate 101 side and a difference between an etching depth in the inter-element gap of the surface-emitting laser elements and an etching depth in the flat part with respect to a mesa interval.

In FIG. 10 and FIG. 11, the vertical axis expresses the difference Δd between the etching depth in the inter-element gap and the etching depth in the flat part, and the horizontal axis expresses the mesa interval.

In FIG. 10 and FIG. 11, ♦ denotes the flat part etching depth and ■ denotes the difference Δd.

When etching is stopped in the middle of the resonator region, even if the mesa interval is 10 micrometers or less, the difference Δd between the etching depth in the inter-element gap and the etching depth in the flat part is 100 nm or less (refer to FIG. 10).

On the other hand, when etching is stopped in the reflection layer 102 arranged on the substrate 101 side and the mesa interval is about 23 micrometers, the difference Δd is set to 100 nm. When the mesa interval is set to 20 micrometers or less, the difference Δd exceeds 100 nm. And when the mesa interval is 10 micrometers or less, the difference Δd becomes large to about 250 nm (refer to FIG. 11).

In this manner, even if a large difference in etching depth between the inter-element part and the flat part arises by the time the etching bottom reaches the resonator region, etching is stopped in the resonator region containing In, the large difference in etching depth is absorbed in the resonator region where the etching rate is small. Even if the mesa interval becomes small, the difference Δd in etching depth between the inter-element gap and the flat part can be made small.

That is, since etching is stopped in the resonator region containing In, it is possible to equalize the etching depth in the in-surface direction DR1 of the wafer in which the inter-element gap where the surface-emitting laser elements 1-32 are arranged densely and the flat part where the surface-emitting laser element is not formed co-exist.

Figure 12:
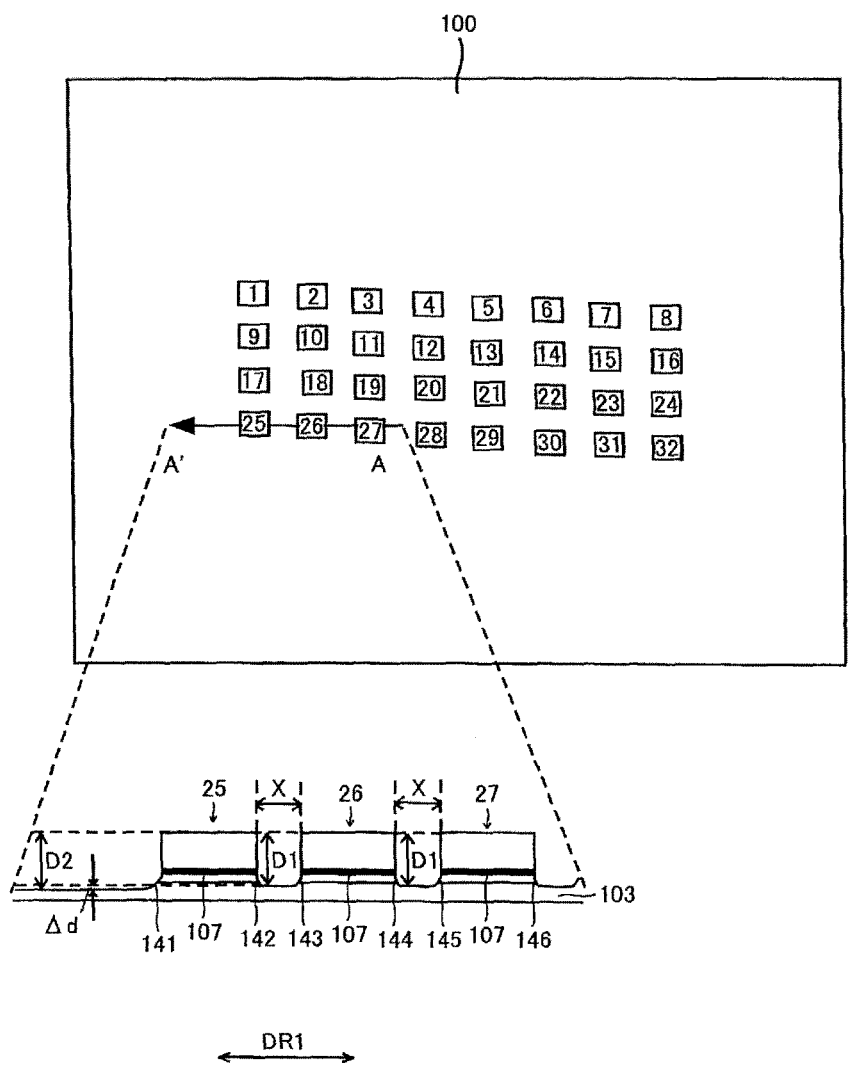
FIG. 12 is a plan view and cross-sectional view of the surface-emitting laser array of FIG. 1.

FIG. 12 is a plan view and cross-sectional view of the surface-emitting laser array 100 of FIG. 1. As shown in FIG. 12, the region where the surface-emitting laser elements 1-32 are arranged is the non-etching region, and the circumference of the surface-emitting laser elements 1-32 is the etching region.

The cross-section taken along the line A-A' include the cross-section of the surface-emitting laser elements 25-27 and the flat part in the vicinity of the surface-emitting laser element 25. The etching depth between the surface-emitting laser elements 25 and 26 and between the surface-emitting laser elements 26 and 27 is set to D1, and the etching depth in the flat part in the vicinity of the surface-emitting laser element 25 is set to D2.

And the etching depth D1 is smaller than the etching depth D2. As a result, the difference between the etching depth D1 and the etching depth D2 is set to Δd.

The skirt portions 141-145 are formed by etching the contact layer 108, the selective oxidation layer 107, the reflection layer 106, the resonator spacer layer 105, the active layer 104, and the resonator spacer layer 103. As mentioned above, the resonator spacer layer 103, 105 and the active layer 104 contain In and the etching rate is relatively slow. For this reason, etching of the surface-emitting laser array 100 in the in-surface direction DR1 also progresses at the time of etching of the resonator spacer layer 103, 105 and the active layer 104. As a result, the size of the skirt portions 141-145 is smaller than that in the existing surface-emitting laser array.

When the skirt portion in the etching configuration has an inclination different from that of the side of the upper part of the mesa structure and the oxidization harrowing layer is contained in the skirt portion in the etching configuration, the width of the selective oxidation layer is larger than the width of the upper part of the mesa structure and it is difficult to estimate the width of the selective oxidation layer correctly. As a result, the estimate of the width of the oxidization region 107b becomes inaccurate, and it is difficult to control the diameter of oxidization narrowing correctly. Therefore, it is desired that the etching bottom enters the resonator region through the whole array chip.

When the thickness of the resonator region is equal to λ (the thickness of the one-wave resonator), it is desired to perform etching so that the center in the thickness direction of the resonator region is in conformity with the etching bottom (the flat part), in order to attain uniformity of the etching depth in the in-surface direction of the wafer surface. In this case, it is desired that Δd is set to λ/2 or less as effectual length in the medium.

Since the emission wavelength of each of the surface-emitting laser elements 1-32 in this embodiment is 780 nm, the thickness of a one-wave resonator is about 230 nm. Therefore, it is desired that the difference Δd is equal to 115 nm or less.

In the existing surface-emitting laser array, when the difference Δd is 115 nm, the mesa interval is 20 micrometers or less (refer to FIG. 11). In the surface-emitting laser array 100 of the invention, the difference Δd is smaller than 100 nm even if the mesa interval is about 20 micrometers. Therefore, the invention is effective when the mesa interval is below 20 micrometers. The thickness of an one-wave resonator is smaller if the wavelength is shorter than 780 nm, and the difference Δd exceeds λ/2 in the region where the mesa interval is larger.

As mentioned above, in the surface-emitting laser array 100, mesa etching for forming the mesa structure is stopped in the middle of the resonator region containing In (or in the middle of the resonator spacer layer 103). Even if the mesa interval becomes small, the difference Δd in etching depth between the inter-element gap and the flat part becomes small, and the low refractive index layer (=AlAs) of the reflection layer 102 is not exposed in the flat part. As a result, even if the selective oxidation of the selective oxidation layer 107 is performed, the low refractive index layer (=AlAs) of the reflection layer 102 is not oxidized.

Therefore, according to the invention, it is possible to escape the heat generated in the active layer 104 to the substrate 1 through AlAs (low refractive index layer) of the reflection layer 102, and it is possible to prevent accumulating heat in the active layer 104 without using dummy elements.

The interval between two adjacent surface-emitting laser elements in the inter-element part means a narrower one of the gap between the surface-emitting laser elements in the position of the top surface of the mesa structure and the gap between the surface-emitting laser elements in the position of the bottom surface of the mesa structure. Whether the gap between the surface-emitting laser elements in the position of the to surface of the mesa structure is larger or the gap between the surface-emitting laser elements in the position of the bottom surface of the mesa structure is larger depends on the method of etching for forming the mesa structure.

Figure 13:
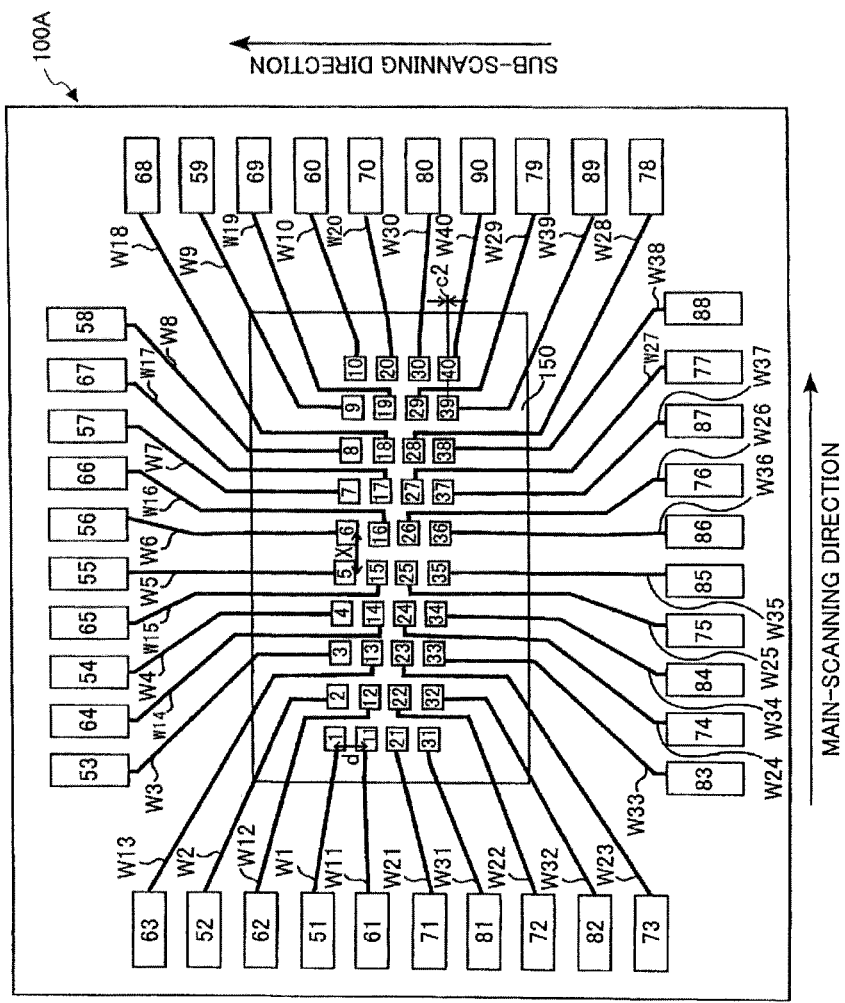
FIG. 13 is a plan view of a surface-emitting laser array in an embodiment of the invention.

FIG. 13 is a plan view of a surface-emitting laser array in an embodiment of the invention. As shown in FIG. 13, the surface-emitting laser array 100A is essentially the same as the surface-emitting laser array 100 of FIG. 1 except that surface-emitting laser elements 33-40, pads 83-90, and wires W33-W40 are added to the surface-emitting laser array 100 of FIG. 1.

In the surface-emitting laser array 100A, the surface-emitting laser elements 1-40 are arranged in a two-dimensional formation of four rows and ten columns. Each of the surface-emitting laser elements 33-40 has the rectangle form one side of which is 16 micrometers long, similar to that in each of the surface-emitting laser elements 1-32.

And the four surface-emitting laser elements: 1,11,21,31/ 2,12,22,32/3,13,23,33/4,14,24,34/5,15,25,35/6,16,26,36/7, 17,27,37/8,18,28,38/9,19,29,39/10,20,30,40 are arranged in the sub-scanning direction while the ten surface-emitting laser elements 1-10/11-20/21-30/31-40 are arranged in the main scanning direction.

The rows of the ten surface-emitting laser elements 1-10/ 11-20/21-30/31-40 arranged in the main scanning direction are shifted in a step-wise manner in the sub-scanning direction, and they are arranged so that 40 laser beams emitted from the 40 surface-emitting laser elements 1-40 do not overlap mutually.

In the ten surface-emitting laser elements 1-10/11-20/21- 30/31-40 arranged in the main scanning direction, the gap between two adjoining surface-emitting laser elements is set to an interval "X". In the four surface-emitting laser elements 1,11,21,31/2,12,22,32/3,13,23,33/4,14,24,34/5,15,25,35/6, 16,26,36/7,17,27,37/8,18,28,38/9,19,29,39/10,20,30,40 arranged in the sub-scanning direction, the gap between two adjoining surface-emitting laser elements is set to an interval "d".

The ten normals from the respective centers of the ten surface-emitting laser elements (e.g., the elements 31-40) arranged in the main scanning direction, to the straight line parallel to the sub-scanning direction are arranged at equal intervals of "$c2$" in the sub-scanning direction to meet the condition "$c2$"="$d$"/10. When the interval d is set to 24 micrometers, the interval c2 is equal to 24/10=2.4 micrometers.

The ten normals from the respective centers of other ten surface-emitting laser elements 1-10/11-20/21-30 arranged in the main scanning direction, to the straight line parallel to the sub-scanning direction are also arranged at equal intervals of "$c2$" which is the same as mentioned above.

The pads 51-90 are arranged around the circumference of the surface-emitting laser elements 1-40 arranged in two-dimensional formation. The wires W1-W40 are arranged to connect the surface-emitting laser elements 1-40 to the pads 51-90, respectively. And each of the wires W33-W40 has a line width of 8 micrometers, for example.

The wires W1-W11, W20, W21, W30-W40 which connect the surface-emitting laser elements 1-11, 20, 21, 30-40 arranged at the outermost circumference among the surface-emitting laser elements 1-40 arranged in two-dimensional formation, to the pads 51-61, 70, 71, 80-90 respectively are arranged without passing by the two adjoining surface-emitting laser elements.

The wires W12-W19, W22-W29 which connect the surface-emitting laser elements 12-19, 22-29 arranged the inside position among the surface-emitting laser elements 1-40 arranged in two-dimensional formation, to the pads 62-69, 72-79 respectively are arranged by passing by two adjoining surface-emitting laser elements in the main scanning direction. If the line width of each of the wires W1-W40 is 8 micrometers as mentioned above, each of the wires W12- W19, W22-W29 can be arranged between two adjoining surface-emitting laser elements in the main scanning direction.

In the region where the pads 51-90 are arranged, the epitaxial layer remains, a groove 150 is formed around the circumference of the surface-emitting laser elements 1-40, and the groove 150 is embedded with polyimide. And the wires are arranged to pass by the top of the polyimide layer. The pads 51-90 are bonded to the epitaxial layer via the insulating layer. By this formation (rather than forming of the pads 1-40 on polyimide), the adhesion of the pads 1-40 and the insulating layer can be increased and separation of the pads at the time of wire bonding can be certainly prevented.

Each of the surface-emitting laser elements 33-40 has the cross-sectional structure that is the same as that of the surface-emitting laser element 1 of FIG. 2 and FIG. 3.

Therefore, mesa etching for forming the mesa structure in the surface-emitting laser array 100A is stopped in the middle of the resonator region containing In (the resonator spacer layer 103), and even if the mesa interval becomes small, the difference Δd in etching depth between the inter-element gap and the flat part becomes small, and the low refractive index layer (=AlAs) of the reflection layer 102 is not exposed in the flat part. As a result, even if the selective oxidation of the selective oxidation layer 107 is performed, the low refractive index layer (=AlAs) of the reflection layer 102 is not oxidized.

Therefore, according to this embodiment, the heat generated in the active layer 104 can be escaped to the substrate 1 via AlAs (low refractive index layer) of the reflection layer 102, and it is possible to prevent the heat from being accumulated in the active layer 104 without using dummy elements.

Figure 14:
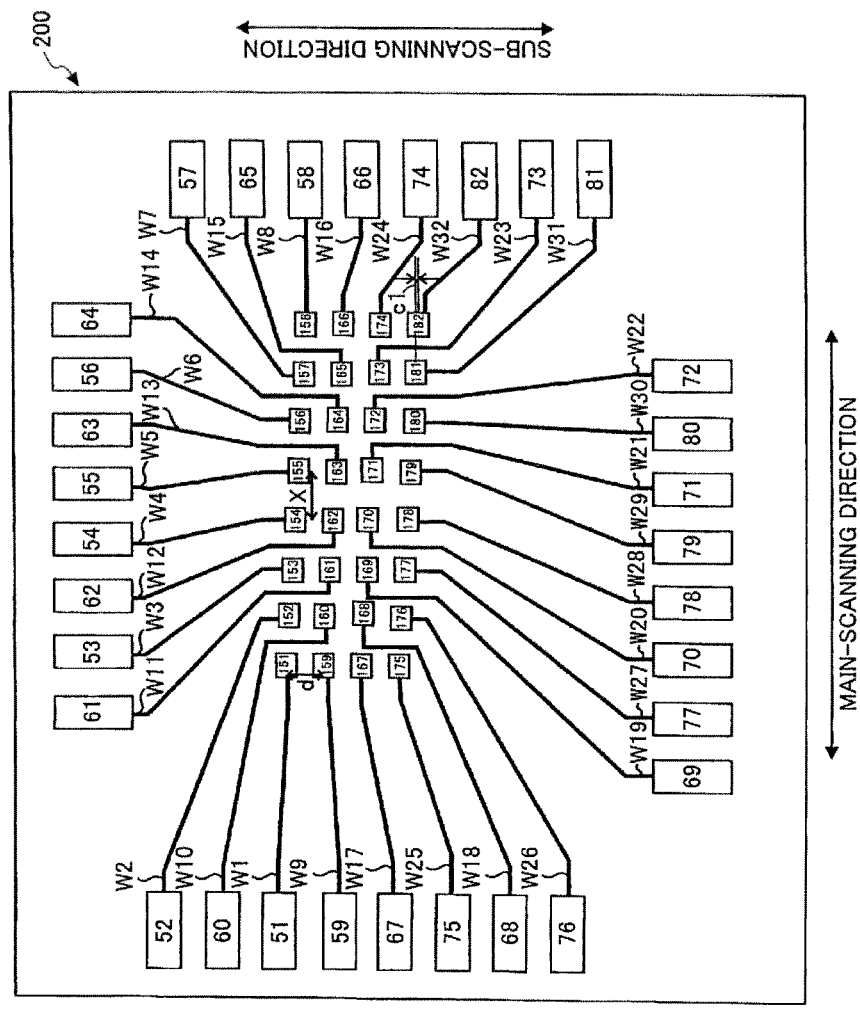
FIG. 14 is a plan view of a surface-emitting laser array in an embodiment of the invention.

FIG. 14 is a plan view of a surface-emitting laser array in an embodiment of the invention. As shown in FIG. 14, in the surface-emitting laser array 200 of this embodiment, the surface-emitting laser elements 1-32 of the surface-emitting laser array 100 of FIG. 1 are replaced by surface-emitting laser elements 151-182, and the other composition is the same as that of the surface-emitting laser array 100.

In the surface-emitting laser array 200, wires W1-W32 connect surface-emitting laser elements 151-182 to pads 51-82, respectively. The surface-emitting laser elements 151- 182 are arranged in a two-dimensional formation of four rows and eight columns.

Each of the surface-emitting laser elements 151-182 has a rectangular form whose one side is equal to 16 micrometers. Eight columns of four surface-emitting laser elements: 151, 159,167,175/152,160,168,176/153,161,169,177/154,162, 170,178/155,163,171,179/156,164,172,180/157,165,173, 181/158,166,174,182 arranged in the sub-scanning direction, and eight surface-emitting laser elements: 151-158/159-166/ 167-174/175-182 are arranged in the main scanning direction. Eight surface-emitting laser elements: 151-158/159- 166/167-174/175-182 arranged in the main scanning direction are shifted in a step-wise manner in the sub-scanning direction, and are arranged in it. As a result, 32 laser beams emitted from 32 surface-emitting laser elements 1-32 do not overlap mutually.

In the eight surface-emitting laser elements: 151-158/159- 166/167-174/175-182 arranged in the main scanning direction, the gap between two adjoining surface-emitting laser elements is set to the interval X.

In the four surface-emitting laser elements: 151,159,167, 175/152,160,168,176/153,161,169,177/154,162,170,178/ 155,163,171,179/156,164,172,180/157,165,173,181/158, 166,174,182 arranged in the sub-scanning direction, the gap between two adjoining surface-emitting laser elements is set to the interval d. The gaps in the sub-scanning direction of eight normals taken down from eight centers of eight surface-emitting laser elements 151-158 arranged in the main scanning direction to the straight line arranged in the sub-scanning direction are arranged at equal intervals of c1.

The gaps in the sub-scanning direction between eight normals to the straight lines from eight centers of eight surface-emitting laser elements 159-166/167-174/175-182 arranged in the main scanning direction arranged in the sub-scanning direction are also arranged at equal intervals of c1.

Figure 15:
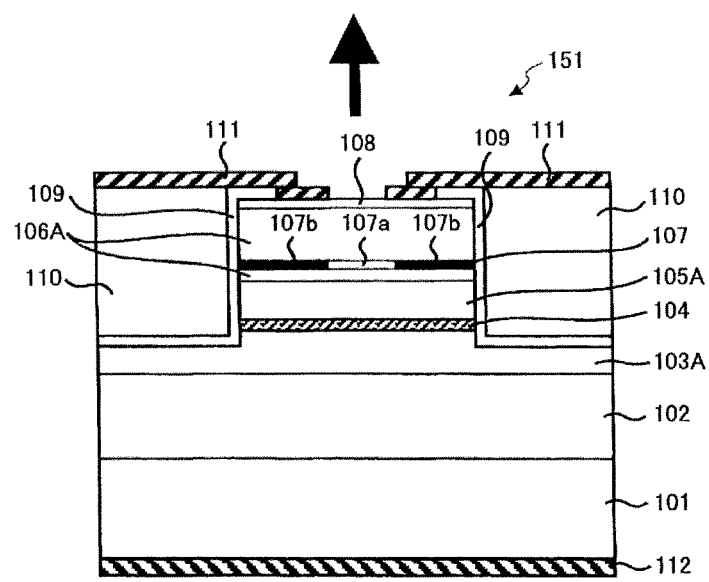
FIG. 15 is a cross-sectional view of a surface-emitting laser element in the surface-emitting laser array of FIG. 14.

FIG. 15 is a cross-sectional view of a surface-emitting laser element 151 in the surface-emitting laser array of FIG. 14. As shown in FIG. 15, in the surface-emitting laser element 151, the resonator spacer layer 103,105 and the reflection layer 106 of the surface-emitting laser element 1 shown in FIG. 2 are replaced by resonator spacer layers 103A and 105A and a reflection layer 106A, respectively, and the other composition is the same as that of the surface-emitting laser element 1.

The resonator spacer layer 103A is constituted by non-doped $(Al_{0.1}Ga_{0.9})_{0.5}In_{0.5}P$ and formed on the reflection layer 102. The resonator spacer layer 105A is constituted by non-doped $(Al_{0.1}Ga_{0.9})_{0.5}In_{0.5}P$ and formed on the active layer 104.

The reflective layer 106A is constituted by p-$(Al_{0.7}Ga_{0.3})_{0.5}In_{0.5}P$ to form the low refractive index layer nearest to the active layer 104 among the reflection layers 106 shown in FIG. 2, and this reflection layer 106A is formed on the resonator spacer layer 105A.

And the reflection layer 106A constitutes a semiconductor distribution Bragg reflector which reflects an emission light beam emitted by the active layer 104 through Bragg's multipath reflection and includes the light beam in the active layer 104.

Figure 16:
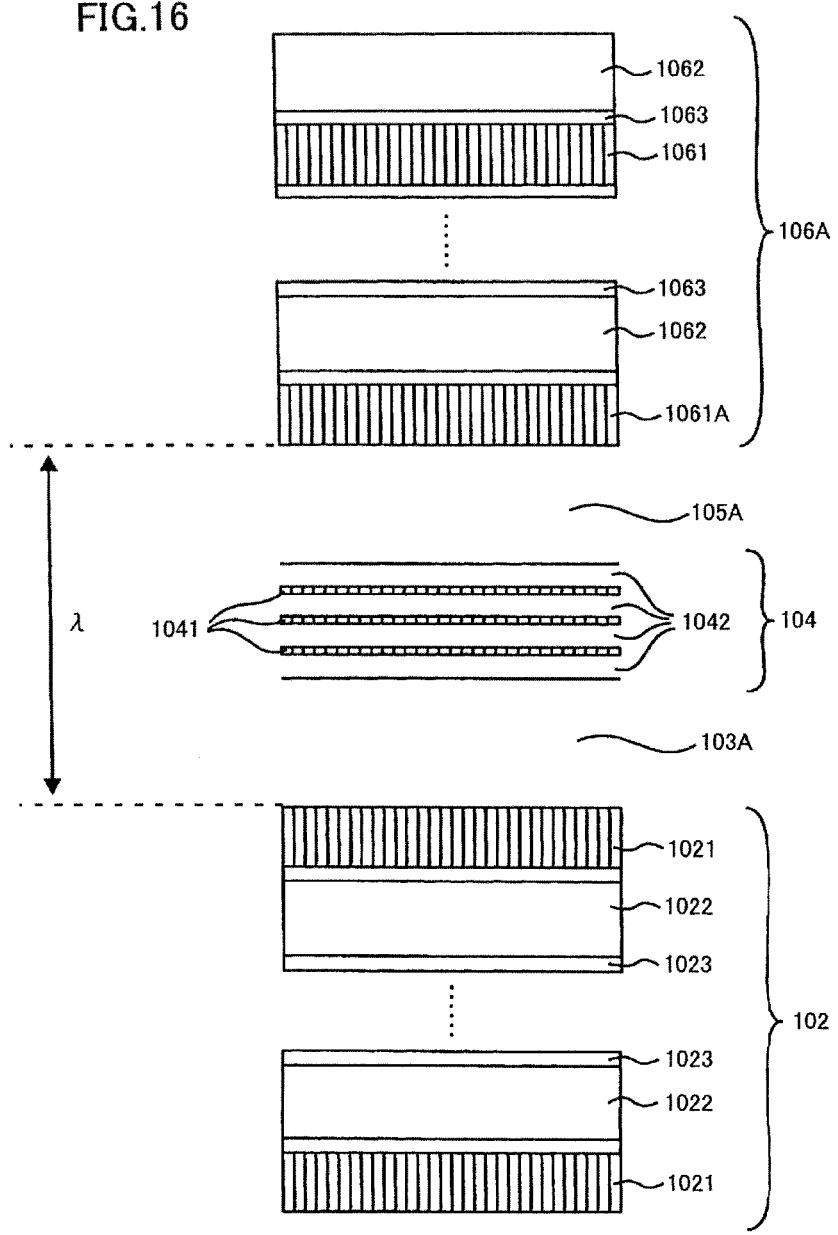
FIG. 16 is a cross-sectional view showing the neighborhood of an active layer of the surface-emitting laser element of FIG. 15.

FIG. 16 is a cross-sectional view showing the neighborhood of the active layer 104 of the surface-emitting laser element 151 shown in FIG. 15. As shown in FIG. 16, the low refractive index layer 1021 of reflection layer 102 touches the resonator spacer layer 103A. The resonator spacer layer 103A touches the low refractive index layer 1021 of reflection layer 102 and the barrier layer 1042 of active layer 104. In the reflective layer 106A, the low refractive index layer 1061 nearest to the active layer 104 among the reflection layers 106 shown in FIG. 3 is replaced by the low refractive index layer 1061A, and the other composition is the same as that of the reflection layer 106.

And the low refractive index layer 1061A is constituted by p-$(Al_{0.7}Ga_{0.3})_{0.5}In_{0.5}P$ and touches the resonator spacer layer 105A. The resonator spacer layer 105A touches the barrier layer 1042 of active layer 104 and the low refractive index layer 1061A of reflection layer 106A.

In the surface-emitting laser element 151, the resonator spacer layers 103A and 105A and the active layer 104 constitute a resonator, and the thickness of the resonator in a direction perpendicular to the substrate 101 is set to one wavelength ($=\lambda$) of the surface-emitting laser element 151. That is, resonator spacer layers 103A and 105A and active layer 104 constitute an one-wave resonator.

Each of the surface-emitting laser elements 152-182 shown in FIG. 14 has the composition which is the same as the composition of the surface-emitting laser element 151 shown in FIGS. 15 and 16.

The surface-emitting laser array 200 is produced according to the manufacturing process of FIGS. 4A-6B.

In this case, in the process of FIG. 4A, $(Al_{0.1}Ga_{0.9})_{0.5}In_{0.5}P$ of the resonator spacer layers 103A and 105A is formed through the MOCVD method by using trimethyl aluminum (TMA), trimethyl gallium (TMG), trimethyl indium (TMI) and phosphine (PH3) as source materials. And p-(Al0.7Ga0.3)0.5In0.5P which constitutes the low refractive index layer 1061A of reflection layer 106A is formed through the MOCVD method by using trimethyl aluminum (TMA), trimethyl gallium (TMG), trimethyl indium (TMI), phosphine (PH3), and dimethyl zinc (DMZn) as source materials. Instead of dimethyl zinc (DMZn), carbon tetrabromide (CBr4) may be used.

In each of the surface-emitting laser elements 151-182 of the surface-emitting laser array 200, the resonator (=resonator spacer layers 103A and 105A and active layer 104) and the part of reflection layer 106A (low refractive index layer 1061A) contains In, and the thickness of the layer containing In is larger than that in the surface-emitting laser elements 1-32. Therefore, control of etching of the surface-emitting laser array 200 is made easier when compared with that of the surface-emitting laser array 100.

In this embodiment, only the low refractive index layer 1061A nearest to the resonator among the reflection layers 106A contains In. Alternatively, this embodiment may be modified so that both a low refractive index layer and a high refractive index layer of the upper reflection layer 106A of the resonator nearer to the resonator contain In. In this case, the low refractive index layer is constituted by $(Al_{0.7}Ga_{0.1})_{0.5}In_{0.5}P$, and the high refractive index layer is constituted by $(Al_{0.1}Ga_{0.9})_{0.5}In_{0.5}P$. In this case, two or more layers may contain In, and the sum of thickness of the layers containing In can be made larger.

And p-$(Al_{0.7}Ga_{0.3})_{0.5}In_{0.5}P$ which is a wide band gap is used in many cases by doping Zn or Mg. Such dopants are easy to be spread. If they are spread to the active layer 104, the active layer 104 may be damaged, which causes the emission light efficiency to decline and causes the reliability to fall.

In the surface-emitting laser elements 151-182, p-$(Al_{0.7}Ga_{0.3})_{0.5}In_{0.5}P$ is arranged in the reflection layer 106A apart from the active layer 104 than the resonator spacer layer 105A, and the resonator spacer layers 103A and 105A are constituted by undoped $(Al_{0.1}Ga_{0.9})_{0.5}In_{0.5}P$. It is possible to prevent the undesired influence of impurities from arising.

Thus, mesa etching for forming mesa structure in the surface-emitting laser array 200 is stopped in the middle of the region containing In (or in the middle of the resonator spacer layer 103A). Even if the mesa interval becomes small, the difference $\Delta d$ in etching depth between the inter-element gap and the flat part becomes small, and the low refractive index layer 1021 (=AlAs) of reflection layer 102 is not exposed in the flat part. As a result, even if the selective oxidation of the selective oxidation layer 107 is performed, the low refractive index layer 1021 (=AlAs) of reflection layer 102 is not oxidized.

Therefore, according to this embodiment, the heat generated in the active layer 104 can be escaped to the substrate 1 via AlAs (low refractive index layer) of the reflection layer 102, and it is possible to prevent the heat from being accumulated in the active layer 104 without using dummy elements. Since the surface-emitting laser array 200 is provided with surface-emitting laser elements 151-182 whose layer thickness containing In is thicker than surface-emitting laser elements 1-32, it can be stopped with controllability more sufficient than surface-emitting laser array 100 in the layer which includes the etching bottom for In.

Next, the output characteristic of the surface-emitting laser array 200 of this embodiment will be explained.

Figure 17:
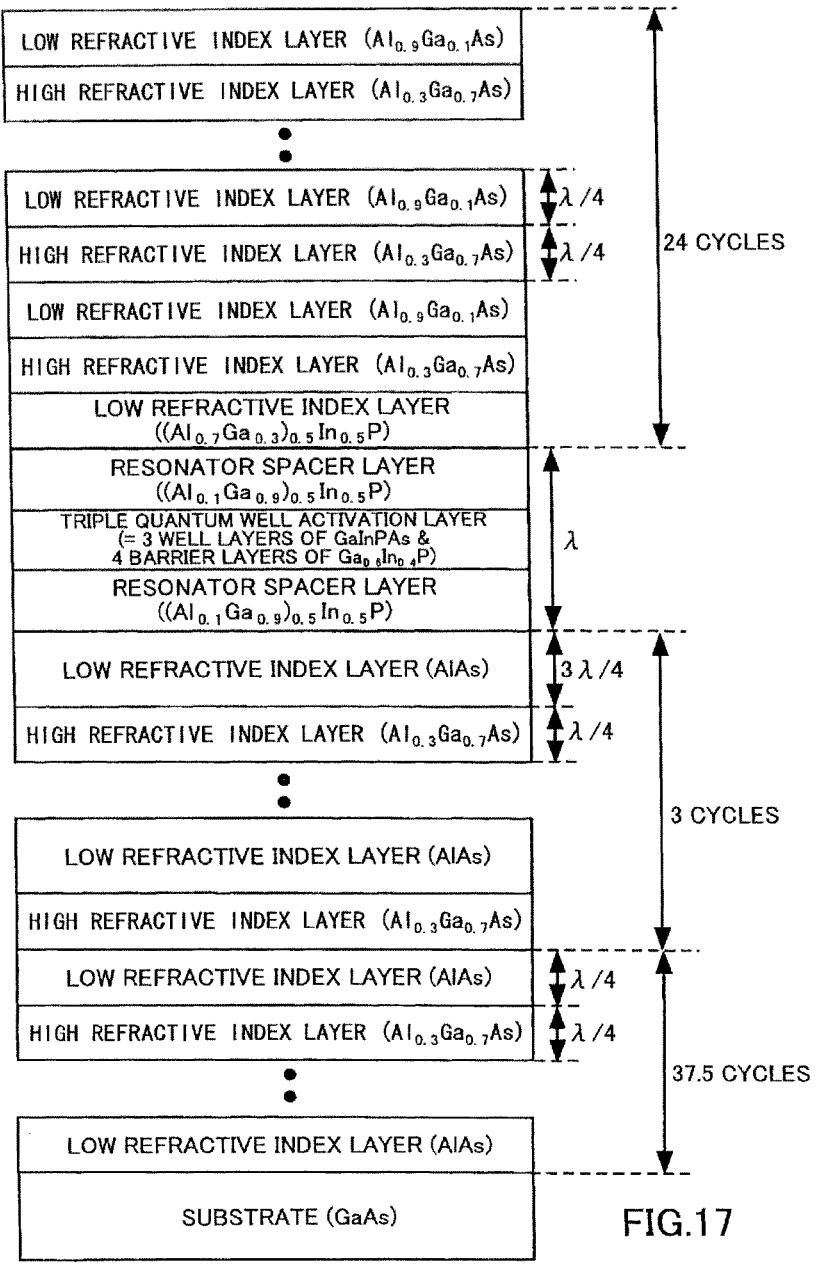
FIG. 17 is a cross-sectional view of the surface-emitting laser element in the embodiment of FIG. 14 used for an experiment.
Figure 18:
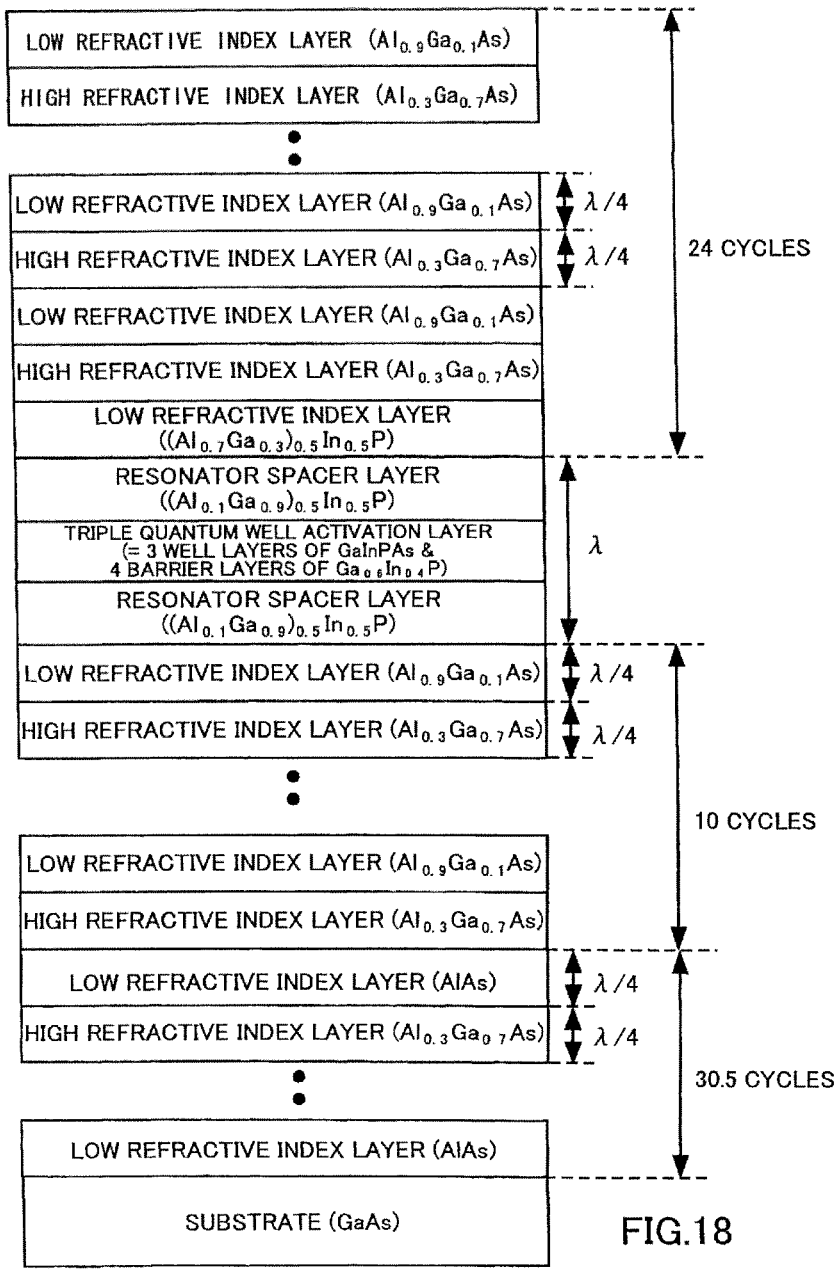
FIG. 18 is a cross-sectional view of a surface-emitting laser element in a comparative example used for an experiment.

FIG. 17 is a cross-sectional view of the surface-emitting laser element in the embodiment of FIG. 14 used for the experiment. FIG. 18 is a cross-sectional view of a surface-emitting laser element in a comparative example used for the experiment.

In the embodiment of FIG. 17, the thickness of three cycles of the low refractive index layer 1021 (=AlAs) near the active layer 104 among the reflection layers 102 of the surface-emitting laser element 151 is set to $3\lambda/4$, and the other composition is the same as that of the surface-emitting laser element 151.

In the comparative example of FIG. 18, the reflection layer 102 of surface-emitting laser element 151 is replaced by a reflection layer which is constituted by 30.5 cycles of n-$Al_{0.3}Ga_{0.7}As$/n-AlAs and 10 cycles of n-$Al_{0.3}Ga_{0.7}As$/n-

$Al_{0.9}Ga_{0.1}As$. And each of n-$Al_{0.3}Ga_{0.7}As$, n-AlAs, and n-$Al_{0.9}Ga_{0.1}As$ has a thickness of $\lambda/4$.

Figure 19:
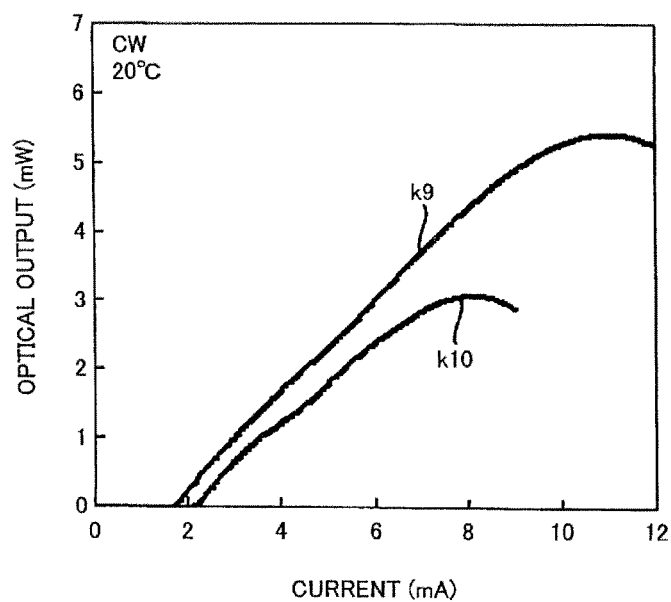
FIG. 19 is a diagram for explaining the relationship between the optical output and the current which show an experimental result.

FIG. 19 is a diagram for explaining the relationship between the optical output and the current which shows an experimental result. In FIG. 19, the vertical axis expresses the optical output and the horizontal axis expresses the current.

The curve k9 shows the relationship between the optical output and the current of the surface-emitting laser element of the invention, and the curve k10 shows the relationship between the optical output and the current of the surface-emitting laser element of the comparative example. The experiment was conducted by observing the continuous wave (CW) at 20 degrees C. from the surface-emitting laser element having the light emitting part with an area of 16 square micrometers.

As is apparent from the experimental result of FIG. 19, the saturation value of the optical output of the surface-emitting laser element by the invention shifts to the high-electric-current value side rather than the saturation value of the optical output of the surface-emitting laser element of the comparative example, and high output is obtained.

In the surface-emitting laser element according the invention, since the low refractive index layer 1021 of reflection layer 102 on the side of substrate 101 is constituted by AlAs having high thermal conductivity, it is because the heat dissipation by the side of substrate 101 became good and the temperature rise of the element at the time of element operation was controlled.

Thus, by the use of AlAs with high thermal conductivity constituting low refractive index layer 1021 of reflection layer 102 provided in substrate 101, and adopting the composition which makes the heat generated in active layer 104 radiate heat to the substrate 101, it was proved experimentally the output characteristic of the surface-emitting laser element and that the output characteristic of the surface-emitting laser array can be improved if it lengthens.

The surface-emitting laser array of this embodiment may be provided with 40 surface-emitting laser elements arranged in four rows×ten columns like surface-emitting laser array 100A (refer to FIG. 13).

The surface-emitting laser array of the invention may be provided so that the resonator spacer layer 103,103A of the surface-emitting laser elements 1-40,151-182 includes surface-emitting laser elements constituted by $Ga_{0.5}In_{0.5}P$. The surface-emitting laser array of the invention may be provided so that the resonator spacer layer 103,103A of the surface-emitting laser elements 1-40,151-182 includes surface-emitting laser elements constituted by $(Al_{0.7}Ga_{0.3})_{0.5}In_{0.5}P/Ga_{0.5}In_{0.5}P$. In this case, $(Al_{0.7}Ga_{0.3})_{0.5}In_{0.5}P$ is arranged on the active layer 104 side, and $Ga_{0.5}In_{0.5}P$ is arranged on the reflection layer 102 side.

While the carrier to the active layer 104 by $(Al_{0.7}Ga_{0.3})_{0.5}In_{0.5}P$ shuts up and is increased, the heat generated in the active layer 104 can be made to radiate heat to the reflection layer 102 more. $Ga_{0.5}In_{0.5}P$ has a thermal conductivity higher than $(Al_{0.7}Ga_{0.3})_{0.5}In_{0.5}P$.

Table 1 shows a difference in band gap between the resonator spacer layer 103,105;103A, 105A, and the well layer 1041 and a difference in band gap between the barrier layer 1042 and the well layer 1041 in the case where the well layers 1041 of the resonator spacer layer 103,105;103A,105A/the active layer 104 are formed from AlGaAs/AlGaAs and in the case where the well layers 1041 are formed from AlGaInP/GaInPAs, respectively.

TABLE 1

| Wavelength | 780 nm | |
|---|---|---|
| Spacer Layer | $Al_{0.6}Ga_{0.4}As$ (Eg = 2.0226 eV) | $(Al_{0.7}Ga_{0.3})_{0.5}In_{0.5}P$ (Eg = 2.324 eV) |
| Active Layer | | |
| Well Layer | $Al_{0.12}Ga_{0.88}As$ (Eg = 1.5567 eV) | GaInAs (Eg = 1.5567 eV) |
| Barrier Layer | $Al_{0.3}Ga_{0.7}As$ (Eg = 1.78552 eV) | $Ga_{0.6}In_{0.4}P$ (Eg = 2.02 eV) |
| ΔEg (spacer/well) | 465.9 meV | 767.3 meV |
| ΔEg (barrier/well) | 228.8 meV | 463.3 meV |
| Wavelength | 850 nm (reference) | |
| Spacer Layer | $Al_{0.6}Ga_{0.4}As$ (Eg = 2.0226 eV) | |
| Active Layer | | |
| Well Layer | GaAs (Eg = 1.42 eV) | |
| Barrier Layer | $Al_{0.3}Ga_{0.7}As$ (Eg = 1.78552 eV) | |
| ΔEg (spacer/well) | 602.6 eV | |
| ΔEg (barrier/well) | 365.5 eV | |

When AlGaAs and AlGaAs are used for the resonator spacer layer 103,105;103A,105A and the well layer 1041 of the active layer 104, respectively, the difference in band gap between the resonator spacer layer 103,105;103A,105A and the well layer 1041 in the surface-emitting laser element whose emission wavelength is 780 nm is 465.9 meV, and the difference in band gap between the barrier layer 1042 and the well layer 1041 is 228.8 meV.

When AlGaAs and AlGaAs are used for the resonator spacer layer 103,105;103A,105A and the well layer 1041 of the active layer 104, respectively, the difference in band gap between the resonator spacer layer 103,105;103A,105A and the well layer 1041 in the surface-emitting laser element whose emission wavelength is 850 nm is 602.6 meV, and the difference in band gap between the barrier layer 1042 and the well layer 1041 is 365.5 meV.

On the other hand, when AlGaInP and GaInPAs are used for the resonator spacer layer 103,105;103A,105A and the well layer 1041 of the active layer 104, respectively, the difference in band gap between the resonator spacer layer 103,105;103A,105A and the well layer 1041 in the surface-emitting laser elements 1-40,151-182 whose emission wavelength is 780 nm is 767.3 meV and the difference in band gap between the barrier layer 1042 and the well layer 1041 is 463.3 meV.

Thus, by constituting the resonator spacer layer 103,105; 103A,105A and the well layer 1041 of the active layer 104 by AlGaInP and GaInPAs, respectively, the difference in band gap between the resonator spacer layer 103,105;103A,105A and the well layer 1041 and the difference in band gap between the barrier layer 1042 and the well layer 1041 can be increased from before.

As a result, the locked-in effect of the carrier to the well layer 1041 remarkably improves and the surface-emitting laser elements 1-40,151-182 can emit a higher-output emission light while oscillating with a low threshold. Since the active layer 104 contains GaInPAs which has a compressive strain, the increase in gain becomes large according to band separation with a heavy hole and a light hole.

Thereby, it becomes high gain and a high output emission light can be obtained with a low threshold. This effect is not acquired with the surface-emitting laser element (780 nm or 850 nm) produced by the AlGaAs system which has the almost same lattice constant as a GaAs substrate.

With the improvement in the carrier inclusion and high gain by the active layer 104 constituted by distorted quantum well structure, the threshold current of the surface-emitting laser elements 1-40,151-182 can be lowered, the reduction of the reflection factor by reflection layer 106,106A on the side of optical extraction are attained with high output emission.

Since the active layer 104 contains a material which does not contain aluminum and is considering it as aluminum free active region (the quantum well active layer and the adjoining layer), when the inclusion of oxygen to these regions decreases, it can control formation of a non-emitting re-coupling center, and can attain long-life operation. This makes the optical writing unit or the light source unit recyclable.

In the above embodiment, the low refractive index layer 1021 of the reflection layer 102 is constituted by AlAs. Alternatively, the low refractive index layer 1021 of the reflection layer 102 arranged rather than the active layer 104 at the substrate 101 side should just consist of a semiconductor material which has an oxidation rate of selective oxidation layer 107, and an oxidation rate more than equivalent. Since the selective oxidation layer 107 is generally constituted by $Al_xGa_{1-x}As$ ($x>=0.9$), the low refractive index layer 1021 constituted by AlAs generally has an oxidation rate equivalent to or larger than the oxidation rate of the selective oxidation layer 107.

In the case of the layer containing aluminum, if the content of aluminum differs, the oxidation rate of the layer with a larger content of aluminum is larger, and if the content of aluminum is the same, the oxidation rate of the layer with a larger thickness is larger.

In the above embodiment, all the low refractive index layers 1021 of the reflection layer 102 are constituted by AlAs. Alternatively, the reflection layer 102 should just equip the active layer 104 side with the low refractive index layer ($=Al_xGa_{1-x}As$ ($x>=0.9$)) which has an oxidation rate more than the oxidation rate of selective oxidation layer 107. This is because the effect which radiates heat to substrate 101 in the heat generated in active layer 104 is high to make high the thermal conductivity of the portion near a heating source (=active layer 104).

In the above embodiment, mesa etching is stopped in the middle of the resonator spacer layer 103,103A. Alternatively, in the surface-emitting laser array 100,100A, it is adequate that mesa etching is stopped in the inside of the resonator (resonator spacer layer 103, active layer 104, and resonator spacer layer 105) or at the interface of the resonator and the reflection layer 106. In the surface-emitting laser array 200, it is adequate that mesa etching is stopped in the inside of the resonator (the resonator spacer layer 103A, the active layer 104 and the resonator spacer layer 105A), or the inside of the low refractive index layer 1061A of the reflection layer 106A, or at the interface of the low refractive index layer 1061A and the high refractive index layer 1062. Generally, it is adequate that mesa etching is stopped on the reflection layer 106 side rather than the reflection layer 102.

Figure 20:
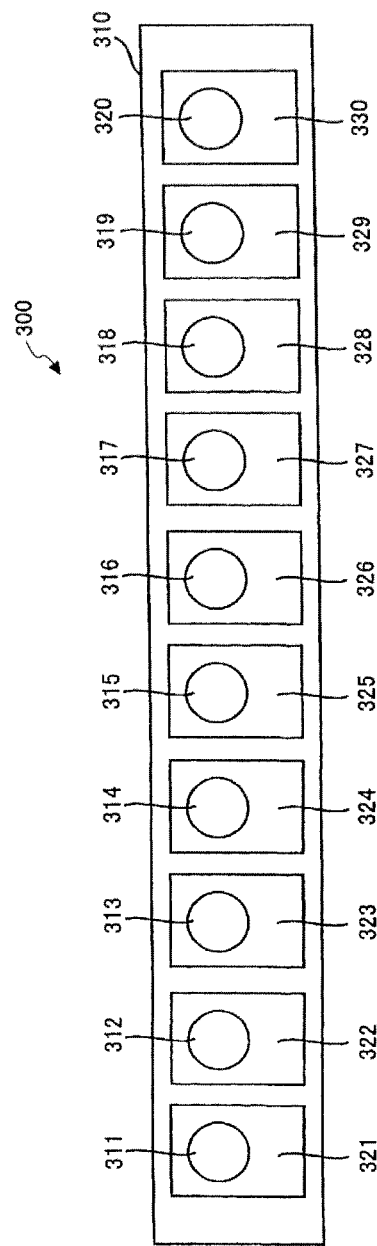
FIG. 20 is a plan view of a surface-emitting laser array in an embodiment of the invention.

FIG. 20 is a plan view of a surface-emitting laser array in an embodiment of the invention. As shown in FIG. 20, the surface-emitting laser array 300 of this embodiment includes substrate 310, surface-emitting laser elements 311-320, and pads 321-330.

The surface-emitting laser elements 311-320 are arranged on the substrate 310 in one dimensional formation. And the surface-emitting laser elements 311-320 are constituted by the surface-emitting laser elements 1-40 or the surface-emitting laser elements 151-182 mentioned above.

The pads 321-330 are arranged around the surface-emitting laser elements 311-320 and connected to the p-type electrode 111, respectively. A threshold rise is controlled, and by accumulating many field emission laser devices 311-320 in which high-output operation is possible on the same substrate 310, since much data transmission by a beam becomes simultaneously possible for example, when it uses for optical communications, high-speed communication can be performed.

Since the radiation characteristic of the heat generated in active layer 104 is also good while operating with low power, surface-emitting laser elements 311-320 can reduce a temperature rise, when it captures into apparatus and uses especially.

Next, a description will be given of a method of manufacturing the surface-emitting laser array in an embodiment of the invention with reference to FIGS. 21A-23.

Figure 21A:
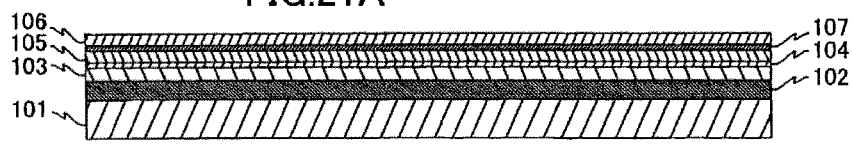

(1) Using the crystal growth using the metal-organic chemical vapor deposition (MOCVD) method, semiconductor layers, including reflection layer (lower reflector) 102, resonator spacer layer (lower spacer layer) 103, active layer 104, resonator spacer layer (upper spacer layer) 105, selective oxidation layer 107, and reflection layer (upper reflector) 106, are laminated on the substrate 101 one by one (refer to FIG. 21A). In the following, the semiconductor layered product in which these layers are laminated is called multilayer semiconductor film.

Figure 21B:
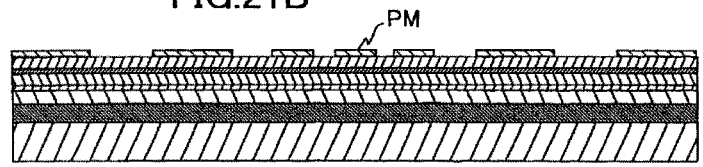

(2) A pattern of photomask PM corresponding to the light emitting part and the array boundary part is formed on the surface of the multilayer semiconductor film (which surface is opposite to the substrate 101) through the photo lithography method (refer to FIG. 21B). In this example, one chip has nine light emitting parts (3×3).

Figure 21C:
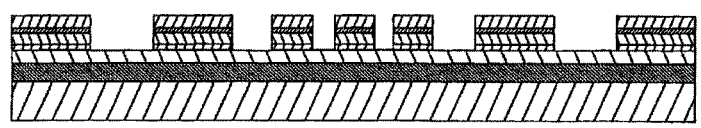

(3) The shape of mesa is formed through the dry etching method using the photomask PM as an etching mask (refer to FIG. 21C). In the following, the shape of mesa is called "mesa" for the sake of convenience. At this time, etching is also performed in the portion used as the array boundary part. In this example, etching is performed until the etching bottom reaches the lower spacer layer 103.

(4) The photomask PM is removed.

Figure 21D:
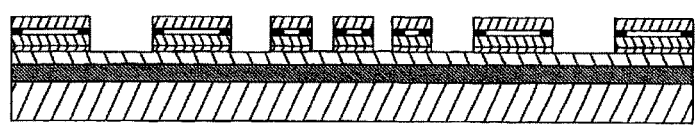

(5) The current narrowing structure is formed in the selective oxidation layer 107 (refer to FIG. 21D).

(6) A pattern of etching mask for etching the array boundary part is formed through the photolithography method.

Figure 22A:
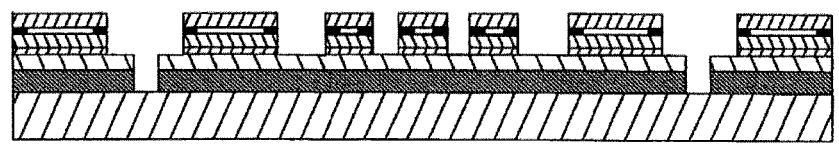
FIG. 22A, FIG. 22B, FIG. 22C, and FIG. 22D are diagrams for explaining a method of manufacturing the surface-emitting laser array in this embodiment.

(7) Etching is performed for the array boundary part until the etching bottom reaches the substrate 101 (refer to FIG. 22A). Each array part is separated or isolated from other array parts, respectively.

Figure 22B:
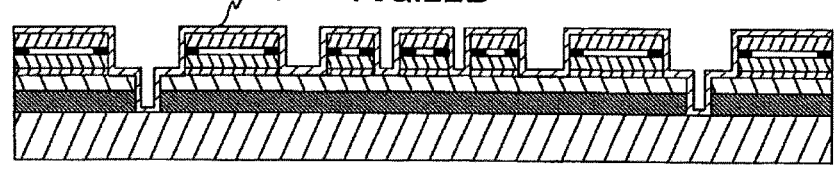

(8) A protection film 109 made of any of $SiO_2$, SiN and SiON is formed as a passivation film (refer to FIG. 22B).

Figure 22C:
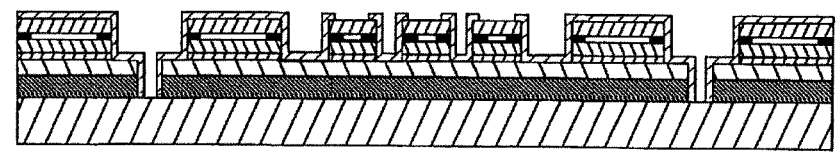

(9) Etching is performed to remove the passivation film at the divided part of the contact of the mesa upper part and the bottom of the array boundary part (refer to FIG. 22C). At this time, the part of the passivation film on the side of the array boundary part is masked so that it is not etched.

Figure 22D:
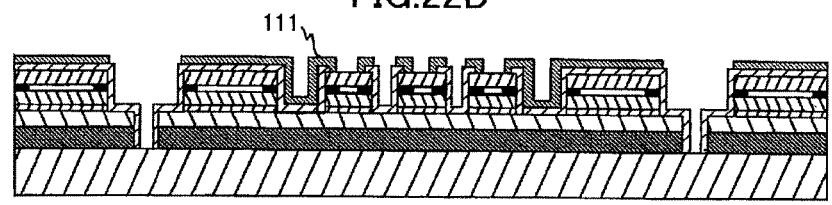

(10) The p-type electrode 111 is formed through the lift-off method (refer to FIG. 22D). The portions other than the electrode are masked beforehand by photoresist, and after vapor deposition of the electrode material ultrasonic cleaning is performed in a solution, such as acetone in which the photoresist dissolves. A multilayer film of Cr/AuZn/Au or a multilayer film of Ti/Pt/Au is used as a p-type electrode material.

Figures 23, 24:
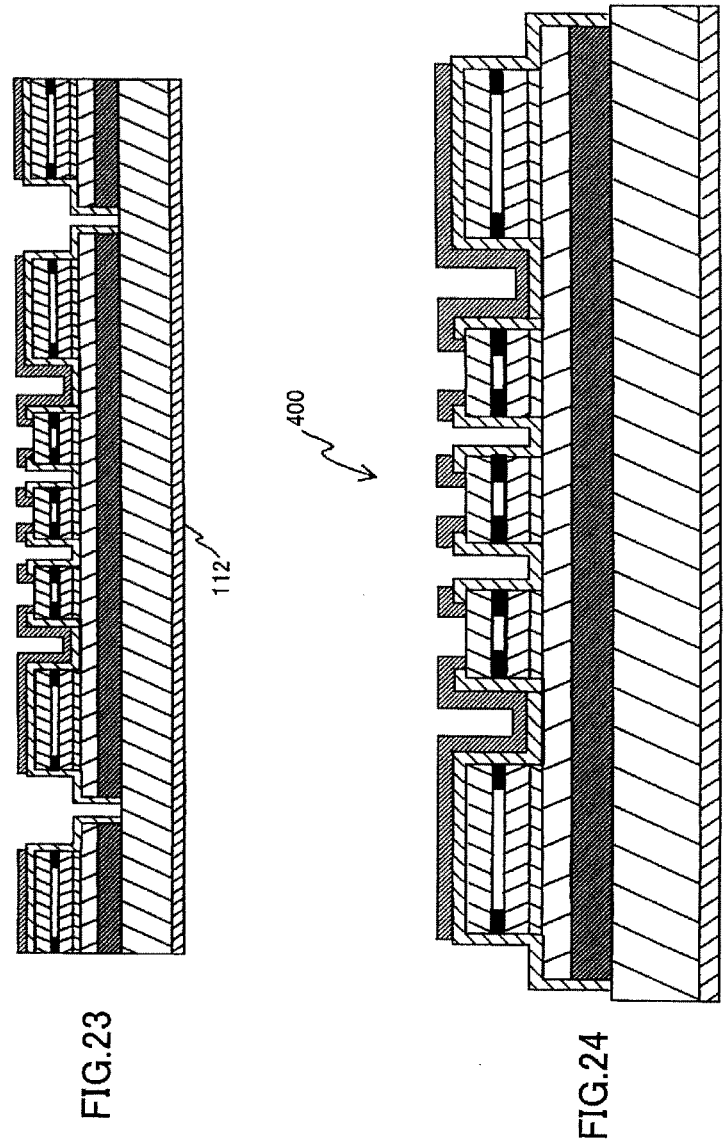
FIG. 23 is a diagram for explaining a method of manufacturing the surface-emitting laser array of this embodiment.
FIG. 24 is a diagram for explaining the surface-emitting laser array of this embodiment.

(11) After grinding of the back surface of the substrate 101 is performed to reach a predetermined thickness (about 100 micrometers), the n-type electrode 112 is formed (refer to FIG. 23). The n-type electrode 112 is constituted by a multilayer film of AuGe/Ni/Au.

(12) The wiring for establishing electrical connections between the electrode pads (not shown) and the electrode pads corresponding to the respective p-type electrodes 111 of the light emitting parts is formed. An opening is formed in the center of the p-type electrode 111, and a laser beam is emitted from this opening. Thereby, each mesa serves as a light emitting part.

(13) Cutting is performed along the divided part of the bottom of the array boundary part to divide the wafer into chips.

The thus produced surface-emitting laser array 400 of this embodiment is shown in FIG. 24. Since this surface-emitting laser array 400 is produced as a divided chip at the time of manufacture, it is possible to reduce the curvature of the substrate 101. Therefore, a manufacturing yield improves and it is possible to attain low cost production.

Since the side of the lower reflector 102 in the surface-emitting laser array 350 is covered by the protection film, it is possible to suppress the low refractive index layer of the lower reflector 102 reacting with moisture in the atmosphere to be oxidized so that distortion is caused and destruction is caused to advance. That is, degradation with the passage of time can be prevented, and it is possible to realize formation of a reliable surface-emitting laser array.

[Applications]

Figure 25:
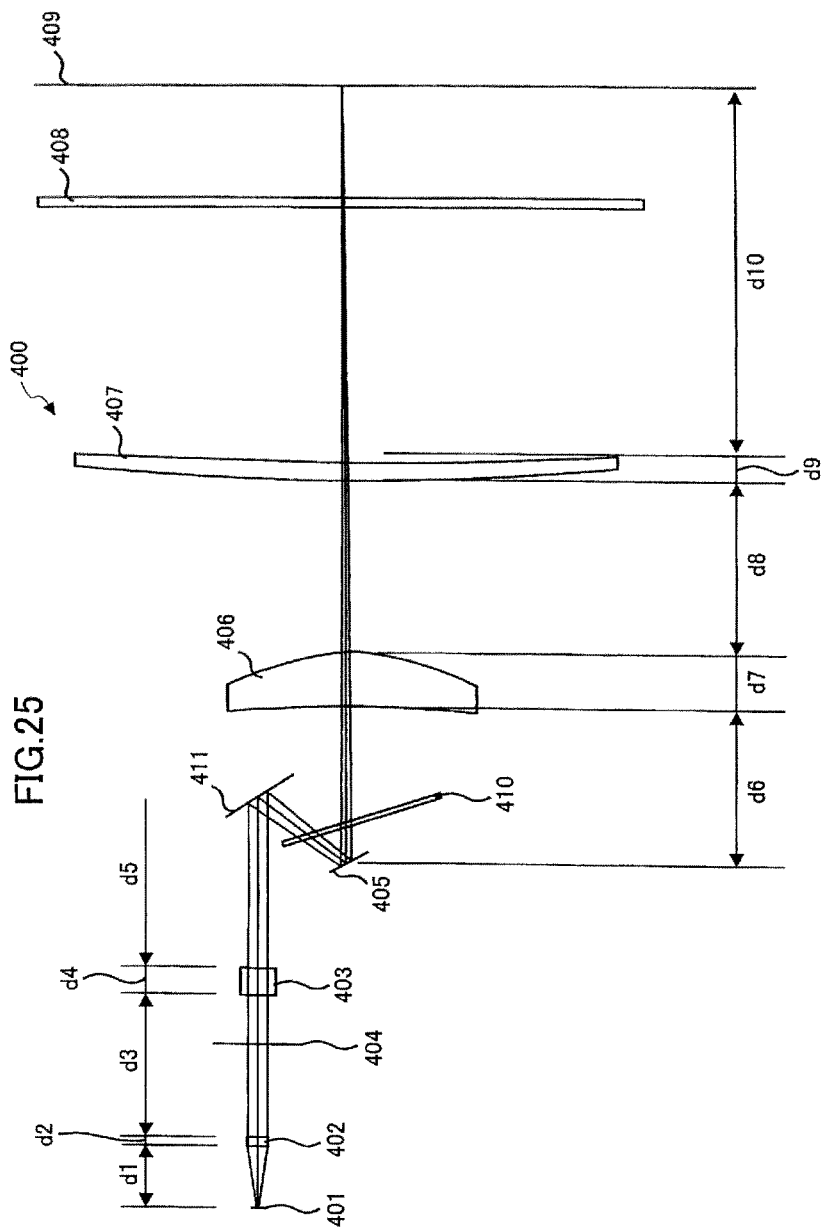
FIG. 25 is a diagram showing the composition of an optical scanning device using the surface-emitting laser array of FIG. 13.

FIG. 25 is a diagram showing the composition of an optical scanning device using the surface-emitting laser array 100A of FIG. 13.

As shown in FIG. 25, the optical scanning device 400 includes a light source 401, a coupling lens 402, an aperture 403, an anamorphic lens 404, a polygon mirror 405, a deflector side scanning lens 406, an image surface side scanning lens 407, a dust-proof glass 408, an image surface glass 408, an image surface 409, a soundproof glass 410, and a dummy lens 411.

The light source 401 is constituted by the surface-emitting laser array 100A shown in FIG. 13. 40 light beams emitted from the light source 401 enter the coupling lens 402 and the coupling lens 402 converts them into slightly divergent light beams and guides them to enter the anamorphic lens 404.

And the light beams incident to the anamorphic lens 404 are converted by the anamorphic lens 404 so that they are parallel in the main scanning direction and convergent in the sub-scanning direction in the vicinity of the polygon mirror 405.

Then, the light beams enter the polygon mirror 405 through the aperture 403, the dummy lens 411, and the soundproof glass 410.

And the light beams are deflected by the polygon mirror 405, pass through the dust-proof glass 408, and image formation is carried out on the image surface 409 by the deflector side scanning lens 406 and the image surface side scanning lens 407.

The light source 401 and the coupling lens 402 are commonly fixed to a component which is made of aluminum.

The light source 401 is constituted by the surface-emitting laser array 100A including 40 surface-emitting laser elements 1-40 arranged so that the gaps in the sub-scanning direction of ten normals to straight lines arranged in the sub-scanning direction from ten centers of the ten surface-emitting laser element 1-10/11-20/21-30/31-40 are arranged at equal intervals of c2 by adjusting the timing of lighting of 40 surface-emitting laser elements 1-40, it can regard on the photoconductor as the same composition as the case where the light source is located in a line in the sub-scanning direction at equal intervals.

The gap of optical writing in the sub-scanning direction can be adjusted by adjusting the inter-element gap c2 of the surface-emitting laser elements 1-40, and the magnification of the optical system. That is, when the surface-emitting laser array 100A (40 channels) is used as light source 401, since the inter-element gap c2 is set as 2.4 micrometers to have mentioned above, it can perform the high-density writing of 4800 dpi by setting up the magnification of the optical system about 2.2 times.

By increasing the number of the elements in the main scanning direction, making smaller the interval c2 between the adjoining surface-emitting elements arranged in the main-scanning direction, making smaller the interval d between the surface-emitting laser elements arranged in the sub-scanning direction, or lowering the magnification of the optical system, high-density optical writing may be attained with high quality printing. In this case, the optical writing gap of the main scanning direction is easily controllable by adjusting the lighting timing of the light source 401.

Thus, in the optical scanning device 400, 40 dots can be written in simultaneously and high-speed printing can be performed. By increasing the number of the surface-emitting laser elements in the surface-emitting laser array 100A, high-speed printing is still more possible.

Since the life of the surface-emitting laser array 100A remarkably improves by using the surface-emitting laser elements 1-40,151-182 for the surface-emitting laser array 100A, the optical writing unit or light source unit can be made recyclable.

In the optical scanning device 400, the light source 401 may be constituted by the surface-emitting laser array 100 of FIG. 1 or the surface-emitting laser array 200 of FIG. 14.

Figure 26:
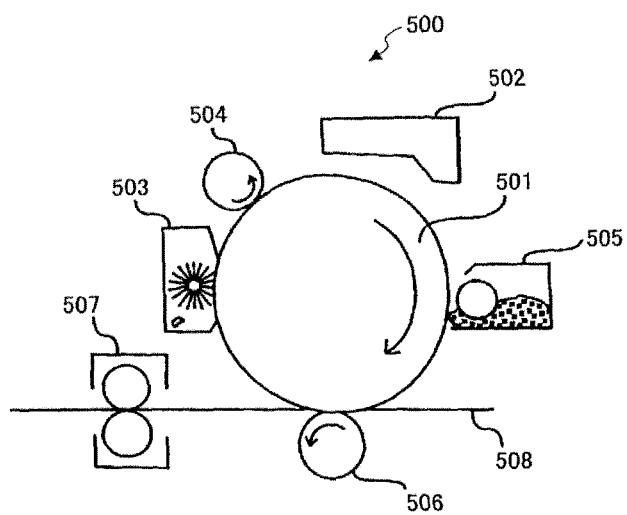
FIG. 26 is a diagram showing the composition of a laser printer.

FIG. 26 is a diagram showing the composition of a laser printer. As shown in FIG. 26, the laser printer 500 includes photoconductor drum 501, optical scanning device 502, cleaning unit 503, charging unit 504, developing unit 505, transferring unit 506, and fixing unit 507.

The optical scanning device 502, the cleaning unit 503, the charging unit 504, the developing unit 505, the transferring unit 506, and the fixing unit 507 are arranged around the periphery of the photoconductor drum 501.

The optical scanning device 502 is constituted by the optical scanning device 400 shown in FIG. 25, and it forms a latent image on the photoconductor drum 501 using the multiple laser beams through the above-mentioned method.

The cleaning unit 503 removes the toner which remains on the photoconductor drum 501. The charging unit 504 charges the surface of the photoconductor drum 501. The developing unit 505 supplies toner to the surface of the photoconductor drum 501, and carries out toner development to the latent image formed by the optical scanning device 502.

The transferring unit 506 transfers the toner image to a recording medium. The fixing unit 507 fixes the transferred toner image to the recording medium.

In the laser printer 500, upon start of operation, the charging unit 504 charges the surface of the photoconductor drum 501, and the optical scanning device 502 forms a latent image on the photoconductor drum 501 by the multiple laser beams.

And the developing unit 505 supplies toner to the latent image formed by the optical scanning device 502, to form a toner image. The transferring unit 506 transfers the toner image to a recording medium, and the fixing unit 507 fixes the transferred toner image to the recording medium. Thereby, a toner picture is transferred on the recording paper 508, after that, a toner image is heat fused by the fixing unit 507, and formation of an electrophotographic image is completed.

On the other hand, an electric discharge unit (not shown) eliminates the latent image on the surface of the photoconductor drum 501 by discharging the photoconductor drum surface, and the cleaning unit 503 removes the toner remaining on the surface of the photoconductor drum 501. Thereby, the above-mentioned electrophotographic operation is repeated so that a series of operation continuously outputs images at high speed. The laser printer 500 constitutes an image forming device in an embodiment of the invention.

Figure 27:
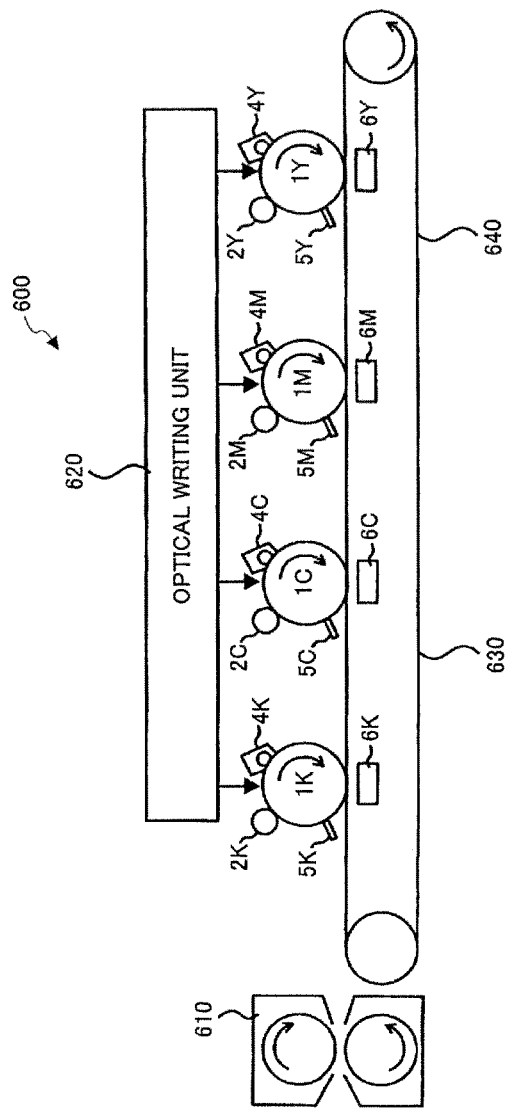
FIG. 27 is a diagram showing the composition of an image forming device.

FIG. 27 is a diagram showing the composition of an image forming device. As shown in FIG. 27, the image forming device 600 includes photoconductors 1Y, 1M, 1C, 1K, charging units 2Y, 2M, 2C, 2K, developing units 4Y, 4M, 4C, 4K, cleaning units 5Y, 5M, 5C, 5K, transferring/charging units 6Y, 6M, 6C, 6K, fixing unit 610, optical writing unit 620, and transferring belt 630. In FIG. 27, Y denotes yellow, M denotes magenta, C denotes cyan, and K denotes black.

The photoconductors 1Y, 1M, 1C, 1K are rotated in the direction indicated by the arrow. The charging units 2Y, 2M, 2C, 2K, the developing units 4Y, 4M, 4C, 4K, the transferring/charging units 6Y, 6M, 6C, 6K, and the cleaning units 5Y, 5M, 5C, 5K are arranged in the sequence according to the direction of rotation.

The charging units 2Y, 2M, 2C, 2K are the components which uniformly charge the surfaces of the photoconductors 1Y, 1M, 1C, 1K. The surfaces of the photoconductors 1Y, 1M, 1C, 1K between the charging units 2Y, 2M, 2C, 2K and the developing units 4Y, 4M, 4C, 4K are irradiated by light beams from the optical writing unit 620 (which is constituted by the optical scanning device 400), so that an electrostatic image is formed on the photoconductors 1Y, 1M, 1C, 1K.

And the developing units 4Y, 4M, 4C, 4K form toner images on the surfaces of the photoconductors 1Y, 1M, 1C, 1K based on the electrostatic images.

And the transferring/charging units 6Y, 6M, 6C, 6K transfer the toner image of each color one by one to the recording paper 640. Finally, the fixing unit 610 fixes the transferred image to the recording paper 640.

Although a color gap of the respective colors may occur due to mechanical accuracy etc., the image forming device 600 is designed for high-density image formation, and can raise the compensation accuracy of the color gap by adjusting the timing of turning on of the surface-emitting laser elements of the surface-emitting laser array used in the optical writing unit 620.

Figure 28:
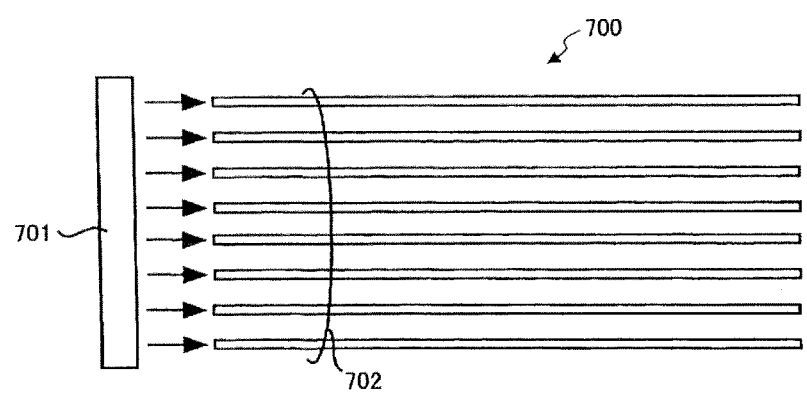
FIG. 28 is a diagram of an optical transmitting module.

FIG. 28 is a diagram the composition of an optical transmitting module. As shown in FIG. 28, the optical transmitting module 700 includes surface-emitting laser array 701 and optical fibers 702.

The surface-emitting laser array 701 is constituted so that the surface-emitting laser elements 1-40,151-182 are arranged in one dimensional formation. The optical fibers 702 are constituted by a plurality of plastic optical fibers (POP). And the plurality of plastic optical fibers are arranged corresponding to the plurality of surface-emitting laser elements 1-40,151-182 of the surface-emitting laser array 701.

In the optical transmitting module 700, the laser beams emitted from the surface-emitting laser elements 1-40,151-182 are transmitted to the corresponding plastic optical fibers, respectively. And an acryl base plastic optical fiber of has a bottom of absorption loss at 650 nm, and a 650 nm surface-emitting laser element is under development. However, it has undesired high temperature characteristics, and it is not yet put into practical use.

An LED (Light Emitting Diode) is used as a light source, but attaining high-speed modulation is difficult. Use of a semiconductor laser is needed for realization of high-speed transmission over 1 Gbps.

The emission wavelength of the surface-emitting laser elements 1-40,151-182 mentioned above is 780 nm. The radiation characteristic is improved, the high output is provided, and the high temperature characteristic is good. Although the absorption loss of the optical fiber is large, the optical transmitting module 700 is usable for short-distance transmission only.

In the field of optical communications, in order to transmit a large amount of data simultaneously, a parallel transmission using a laser array in which a plurality of semiconductor lasers are integrated is developed. With this technology, high-speed parallel transmission is possible and simultaneous transmission of a large amount of data is possible.

In the optical transmitting module 700, the surface-emitting laser elements 1-40,151-182 correspond to the optical fibers respectively. Alternatively, several surface-emitting laser elements having different emission wavelengths may be arranged in one-dimensional or two-dimensional array formation, and the transmission rate may be increased by performing wavelength-multiplexing transmission.

Moreover, the optical transmitting module 700 in which the surface-emitting laser array using the surface-emitting laser elements 1-40,151-182 and the in-expensive POFs are combined makes it possible to provide a low-cost optical transmitting module and an optical fiber communications system using the same.

Since the optical fiber communications system is low cost, it is effective in the short-distance data communications for the purpose of home use, office use, in-device use, etc.

Figure 29:
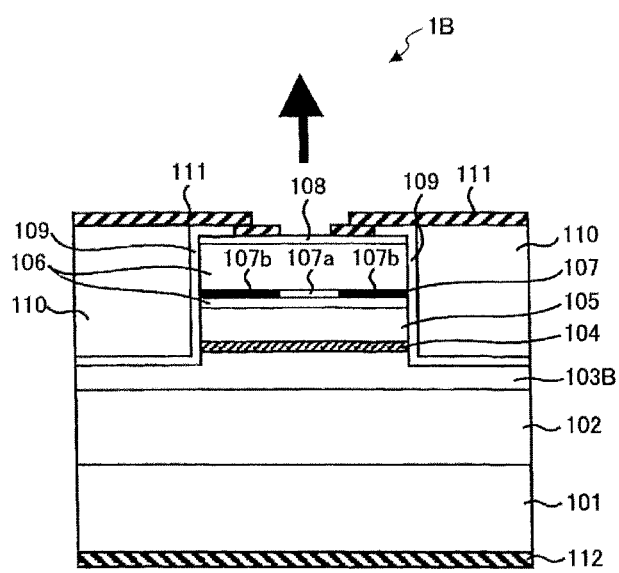
FIG. 29 is a cross-sectional view of a modification of the surface-emitting laser element in the surface-emitting laser array of FIG. 1.

FIG. 29 is a cross-sectional view of a modification of the surface-emitting laser elements 1-32 of FIG. 1.

In this embodiment, each of the surface-emitting laser elements 1-32 of FIG. 1 is constituted by the surface-emitting laser element 1B of FIG. 29. As shown in FIG. 29, in the surface-emitting laser element 1B, the resonator spacer layer 103 of the surface-emitting laser element 1 of FIG. 3 is replaced by the resonator spacer layer 103B, and the other composition is the same as that of the surface-emitting laser element 1.

The resonator spacer layer 103B is constituted by non-doped $Ga_{0.5}In_{0.5}P$ and formed on the reflection layer 102. And $Ga_{0.5}In_{0.5}P$ has a thermal conductivity larger than $(Al_{0.7}Ga_{0.3})_{0.5}In_{0.5}P$ which constitutes the resonator spacer layer 103.

Figure 30:
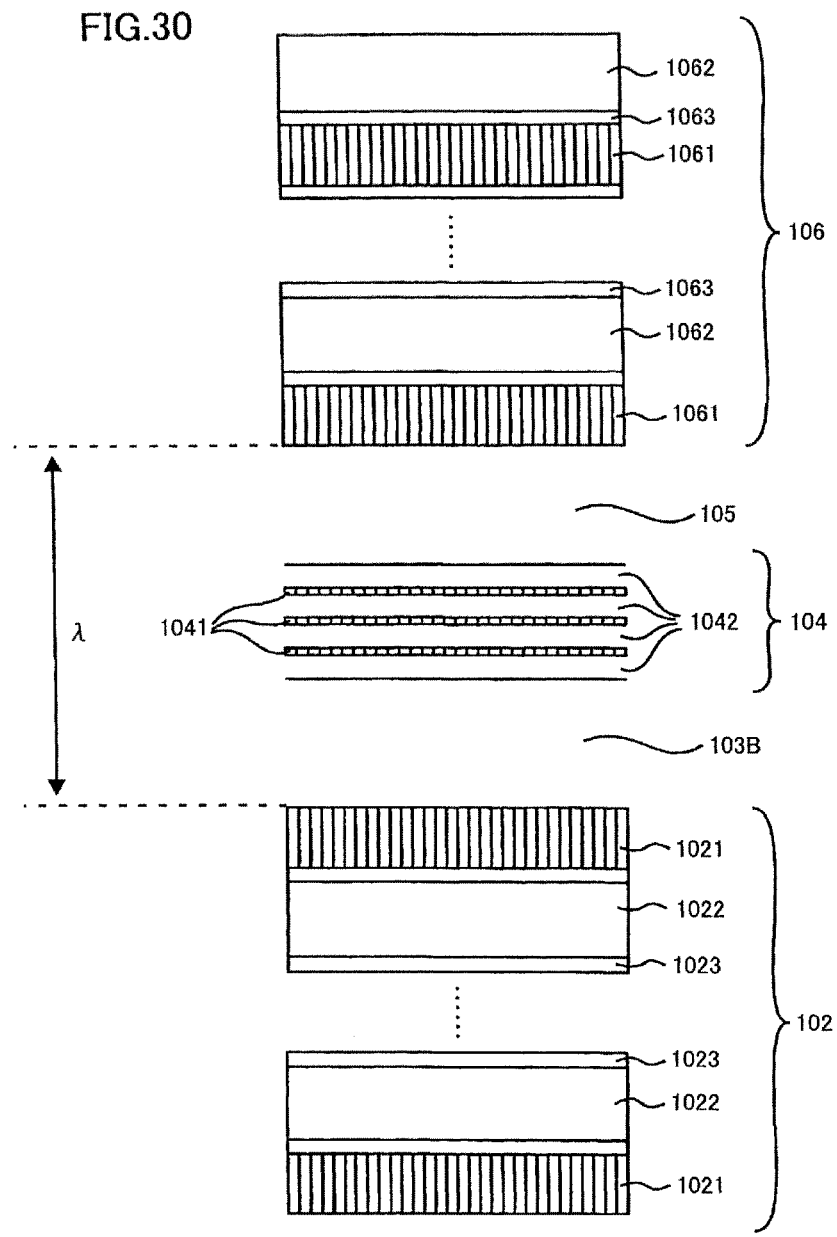
FIG. 30 is a cross-sectional view showing the neighborhood of the active layer of the surface-emitting laser element of FIG. 29.

FIG. 30 is a cross-sectional view showing the neighborhood of the active layer 104 of the surface-emitting laser element 1B of FIG. 29. As shown in FIG. 30, the low refractive index layer 1021 of the reflection layer 102 touches the resonator spacer layer 103B. The resonator spacer layer 103B touches the low refractive index layer 1021 of the reflection layer 102 and the barrier layer 1042 of the active layer 104.

In the surface-emitting laser element 1B, the resonator spacer layers 103B and 105 and the active layer 104 constitute a resonator, and the thickness of the resonator in a direction perpendicular to the substrate 101 is set to one wavelength ($=\lambda$) of the surface-emitting laser element 1B. That is the resonator spacer layers 103B and 105 and the active layer 104 constitute a one-wave resonator.

The surface-emitting laser array 100 including the surface-emitting laser elements 1B is produced according to the manufacturing process of FIGS. 4A-6B. In this case, in the process of FIG. 4A, $Ga_{0.5}In_{0.5}P$ of the resonator spacer layer 103B is formed through the MOCVD method by using trimethyl gallium (TMG), trimethyl indium (TMI) and phosphine (PH3) as source materials.

Since the resonator (=resonator spacer layers 103B and 105 and active layer 104) contains In, it constitutes an absorption layer which absorbs the difference of the etching depth in the in-surface direction when forming the mesa structure.

At the time of production of the surface-emitting laser array 100 using the surface-emitting laser element 1B, etching for forming the mesa structure is suspended in the middle of the resonator (the resonator spacer layer 103B), the difference Δd in etching depth between the inter-element portion 120 and the flat part 130 becomes small.

Therefore, according to the invention, the difference of the etching depth in the in-surface direction DR1 of the substrate 101 can be reduced without using dummy elements.

Since the difference Δd in etching depth between the inter-element portion 120 and the flat part 130 is small, the probability of cutting off of the wires W1-W32 can be lowered.

Since the pads 51-82 are arranged in the flat part 130, it is possible to prevent the mesa structure from being damaged by the pads 51-82 at the time of wire bonding.

In contrast to the surface-emitting laser element 1, the surface-emitting laser element 1B is provided so that the resonator spacer layer 103B is constituted by $Ga_{0.5}In_{0.5}P$ having a thermal conductivity larger than $(Al_{0.7}Ga_{0.3})_{0.5}In_{0.5}P$, and most of heat generated in the active layer 104 can be radiated to the substrate 101 side.

In the above embodiment, the bottom of the mesa structure is located in the middle of the resonator spacer layer 103B. Alternatively, the bottom of the mesa structure may be located in an arbitrary position in the thickness direction of the resonator (=resonator spacer layers 103B and 105 and active layer 104) containing In.

Figure 31:
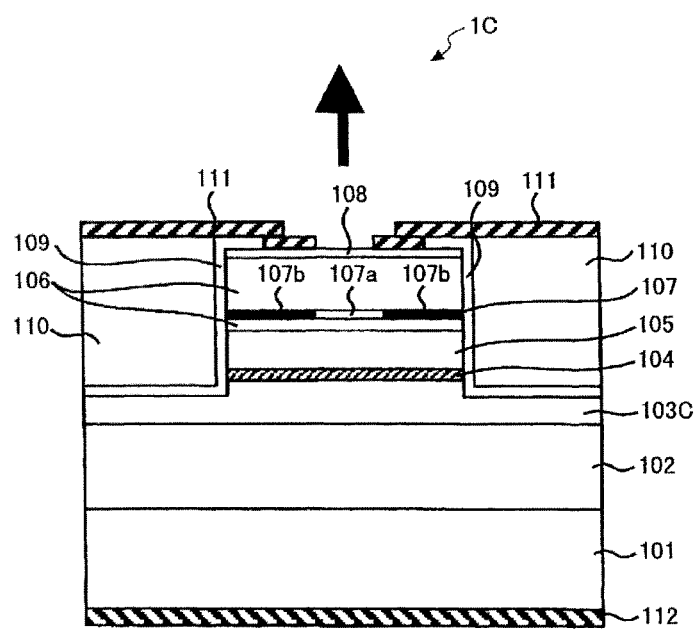
FIG. 31 is a cross-sectional view of a modification of the surface-emitting laser element in the surface-emitting laser array of FIG. 1.

FIG. 31 is a cross-sectional view of a modification of the surface-emitting laser elements 1-32 of FIG. 1. In this embodiment, each of the surface-emitting laser elements 1-32 of FIG. 1 is constituted by the surface-emitting laser element 1C of FIG. 31.

As shown in FIG. 31, in the surface-emitting laser element 1C, the resonator spacer layer 103 of the surface-emitting laser element 1 of FIG. 3 is replaced by the resonator spacer layer 103C, and the other composition is the same as that of the surface-emitting laser element 1.

The resonator spacer layer 103C is constituted by non-doped $(Al_{0.7}Ga_{0.3})_{0.5}In_{0.5}P/Ga_{0.5}In_{0.5}P$ and formed on the reflection layer 102.

Figure 32:
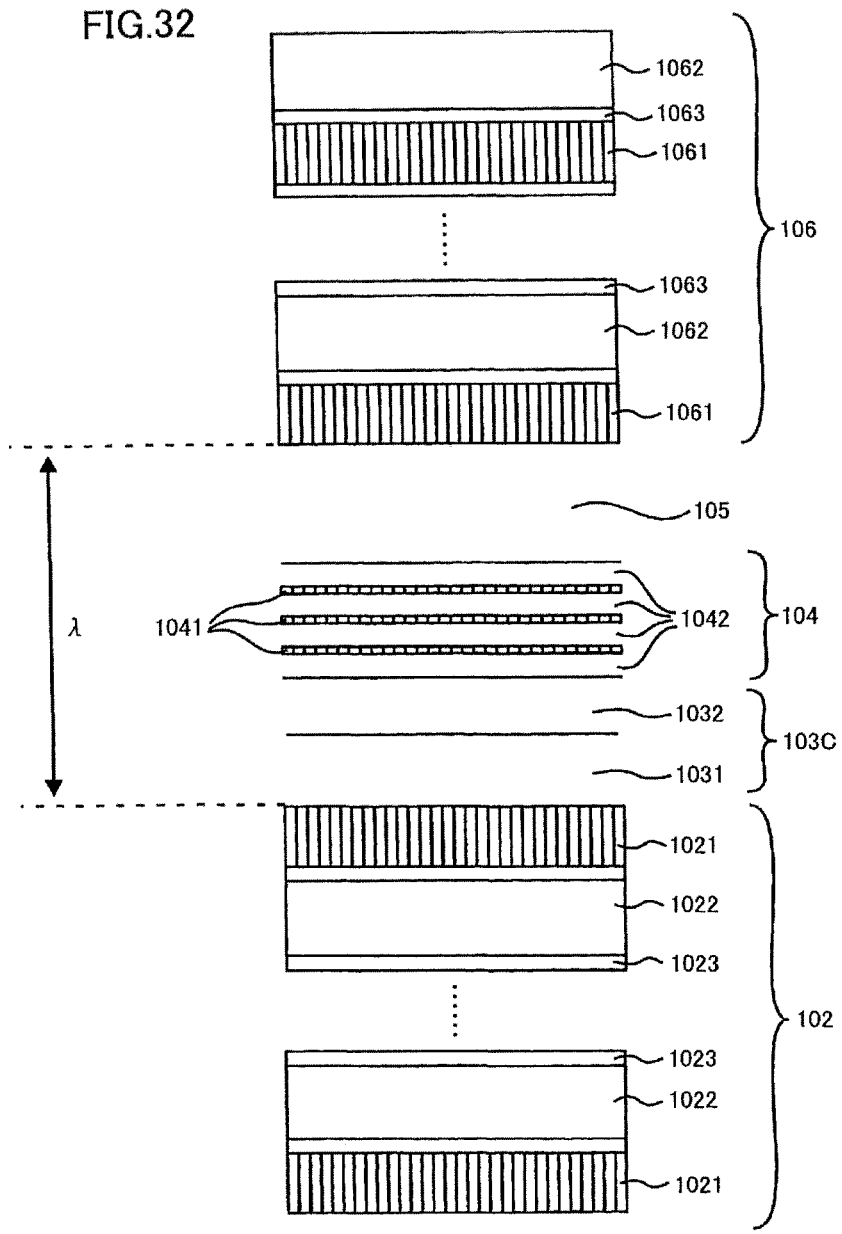
FIG. 32 is a cross-sectional view showing the neighborhood of the active layer of the surface-emitting laser element of FIG. 31.

FIG. 32 is a cross-sectional view showing the neighborhood of the active layer 104 of the surface-emitting laser element 1C of FIG. 31. As shown in FIG. 32, the resonator spacer layer 103C is constituted by the spacer layers 1031 and 1032. The spacer layer 1031 is formed in contact with the low refractive index layer 1021 of the reflection layer 102, and the spacer layer 1032 is formed in contact with the barrier layer 1042 of the active layer 104.

The spacer layer 1031 is constituted by $Ga_{0.5}In_{0.5}P$. The spacer layer 1032 is constituted by $(Al_{0.7}Ga_{0.3})_{0.5}In_{0.5}P$.

In the surface-emitting laser element 1C, the resonator spacer layers 103C and 105 and the active layer 104 constitute a resonator, and the thickness of the resonator in a direction perpendicular to the substrate 101 is set to one wavelength (=λ) of the surface-emitting laser element 1C. That is, the resonator spacer layers 103C and 105 and the active layer 104 constitute a one-wave resonator.

The surface-emitting laser array 100 including the surface-emitting laser elements 1C is produced according to the manufacturing process of FIGS. 4A-6B. In this case, in the process of FIG. 4A, $(Al_{0.7}Ga_{0.3})_{0.5}In_{0.5}P/Ga_{0.5}In_{0.5}P$ of the resonator spacer layer 103C is formed through the MOCVD method by using trimethyl aluminum (TMA), trimethyl gallium (TMG), trimethyl indium (TMI) and phosphine (PH3) as source materials.

Since the resonator (=the resonator spacer layers 103C and 105 and the active layer 104) contains In, it constitutes an absorption layer which absorbs the difference of the etching depth in the in-surface direction when forming the mesa structure.

At the time of production of the surface-emitting laser array 100 using the surface-emitting laser elements 1C, etching for forming the mesa structure is suspended in the middle of the resonator (the resonator spacer layer 103C), and the difference Δd in etching depth between the element-arrangement portion 120 and the flat part 130 becomes small.

Therefore, according to the invention, the difference of the etching depth in the in-surface direction DR1 of the substrate 101 can be reduced without using a dummy element.

Since the difference Δd in etching depth between the element-arrangement portion 120 and the flat part 130 is small, the probability of cutting off of the wires W1-W32 can be reduced.

Since the pads 51-82 are arranged in the flat part 130, it is possible to prevent the mesa structure from being damaged by the pads at the time of wire bonding.

In the surface-emitting laser element 1C, the spacer layer 1032 which touches the active layer 104 among the resonator spacer layers 103C is constituted by $(Al_{0.7}Ga_{0.3})_{0.5}In_{0.5}P$ which is a wide band gap material.

The spacer layer 1031 which touches the low refractive index layer 1021 (=AlAs) of the reflection layer 102 is constituted by $Ga_{0.5}In_{0.5}P$. For this reason, in contrast to the surface-emitting laser element 1, most of heat generated in the active layer 104 can be radiated to the substrate 101 side, and it is possible to provide the degree of carrier which is the same as the degree of carrier included in the surface-emitting laser element 1.

In the above embodiment, the bottom of the mesa structure is located in the middle of resonator spacer layer 103C. Alternatively, the bottom of the mesa structure may be located in an arbitrary position in the thickness direction of the resonator (=the resonator spacer layers 103C and 105 and the active layer 104) containing In.

Figure 33:
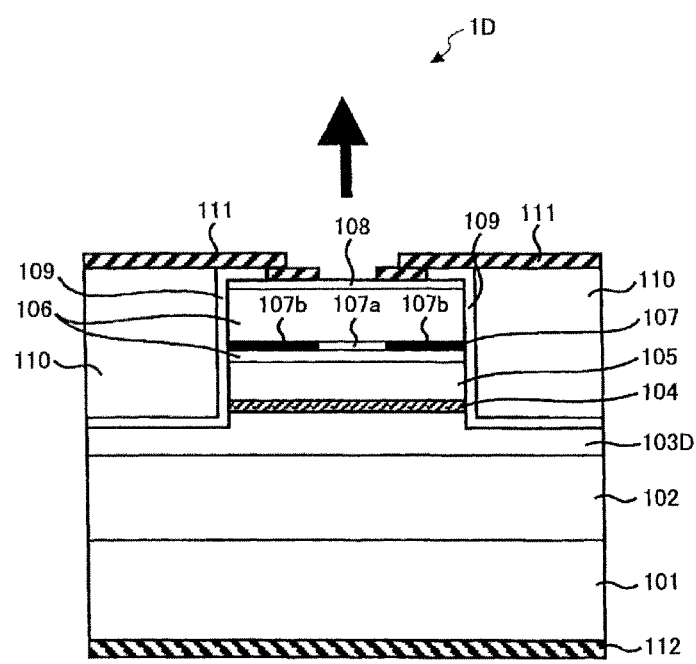
FIG. 33 is a cross-sectional view of a modification of the surface-emitting laser element in the surface-emitting laser array of FIG. 1.

FIG. 33 is a cross-sectional view of a modification of the surface-emitting laser elements 1-32 of FIG. 1.

In this embodiment, each of the surface-emitting laser elements 1-32 of FIG. 1 is constituted by the surface-emitting laser element 1D of FIG. 33. As shown in FIG. 33, in the surface-emitting laser element 1D, the resonator spacer layer 103 of the surface-emitting laser element 1 of FIG. 3 is replaced by the resonator spacer layer 103D, and the other composition is the same as that of the surface-emitting laser element 1.

The resonator spacer layer 103D is constituted by non-doped $(Al_{0.7}Ga_{0.3})_{0.5}In_{0.5}P/AlGaAs$ and formed on the reflection layer 102.

Figure 34:
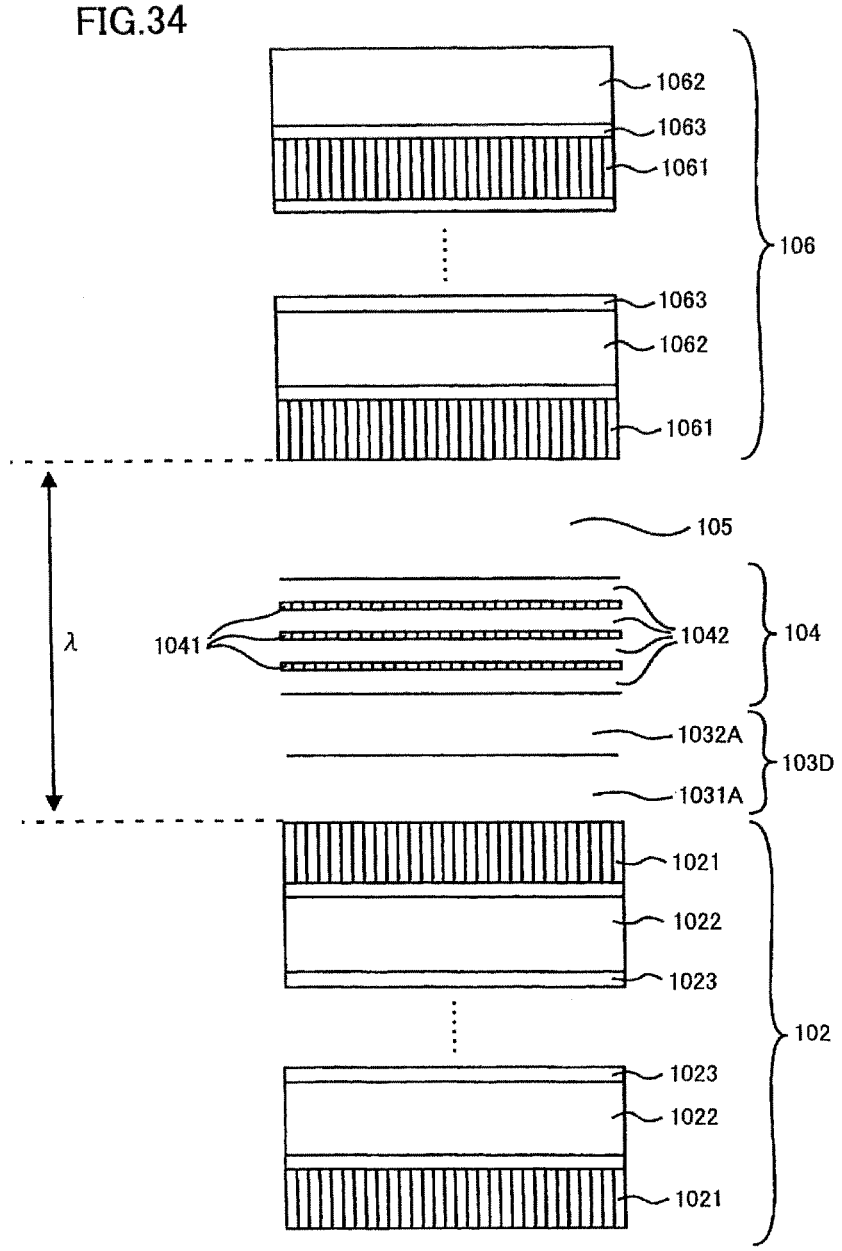
FIG. 34 is a cross-sectional view showing the neighborhood of the active layer of the surface-emitting laser element of FIG. 33.

FIG. 34 is a cross-sectional view showing the neighborhood of the active layer 104 of the surface-emitting laser element 10 of FIG. 33. As shown in FIG. 34, the resonator spacer layer 103D is constituted by the spacer layers 1031A and 1032A. The spacer layer 1031A is formed in contact with the low refractive index layer 1021 of the reflection layer 102, and the spacer layer 1032A is formed in contact with the barrier layer 1042 of the active layer 104.

The spacer layer 1031A is constituted by AlGaAs having a thermal conductivity larger than that of $(Al_{0.7}Ga_{0.3})_{0.5}In_{0.5}P$. The spacer layer 1032A is constituted by $(Al_{0.7}Ga_{0.3})_{0.5}In_{0.5}P$.

In the surface-emitting laser element 1D, the resonator spacer layers 103D and 105 and the active layer 104 constitute a resonator, and the thickness of the resonator in a direction perpendicular to the substrate 101 is set to one wavelength (=λ) of the surface-emitting laser element 1D. That is, the resonator spacer layers 103D and 105 and the active layer 104 constitute a one-wave resonator.

The surface-emitting laser array 100 including the surface-emitting laser elements 10 is produced according to the manufacturing process of FIGS. 4A-6B. In this case, in the process of FIG. 4A, $(Al_{0.7}Ga_{0.3})_{0.5}In_{0.5}P$ of the resonator spacer layer 103D is formed through the MOCVD method by using trimethyl aluminum (TMA), trimethyl gallium (TMG), trimethyl indium (TMI), and phosphine (PH3) as source materials, and AlGaAs of the resonator spacer layer 103D is formed by using trimethyl aluminum (TMA), trimethyl gallium (TMG), and arsine (AsH3) as source materials.

Since the spacer layer 1032A of the resonator spacer layer 103D, the active layer 104 and the resonator spacer layer 105 contain In, they constitute an absorption layer which absorbs the difference of the etching depth in the in-surface direction when forming the mesa structure.

At the time of production of the surface-emitting laser array 100 including the surface-emitting laser elements 1D, etching for forming the mesa structure is suspended in the middle of the spacer layer 1032A of the resonator spacer layer 103D, and the difference Δd in etching depth between the element-arrangement portion 120 and the flat part 130 becomes small.

Therefore, according to the invention, the difference in etching depth in the in-surface direction DR1 of the substrate 101 can be reduced without using dummy elements.

Since the difference Δd in etching depth between the element-arrangement portion 120 and the flat part 130 is small, the probability of cutting off of the wires W1-W32 can be lowered. Since the pads 51-82 are arranged in the flat part 130, it is possible to prevent the mesa structure from being damaged by the pads 51-82 at the time of wire bonding.

In the surface-emitting laser element 1D, the spacer layer 1032A which touches the active layer 104 among the resonator spacer layers 103D is constituted by $(Al_{0.7}Ga_{0.3})_{0.5}In_{0.5}P$ which is a wide band gap material. The spacer layer 1031A which touches the low refractive index layer 1021 (=AlAs) of the reflection layer 102 is constituted by AlGaAs.

Therefore, in contrast to the surface-emitting laser element 1, heat can be more mostly radiated to the substrate 101 side in the heat which realized the same carrier contained as the degree of carrier contained in surface-emitting laser element 1, and was generated in the active layer 104.

In the above embodiment, the bottom of the mesa structure is located in the middle of the spacer layer 1032A. Alternatively, the bottom of the mesa structure may be located in an arbitrary position in the thickness direction of the spacer layer 1032A containing In, the active layer 104, and the resonator spacer layer 105.

Figure 35:
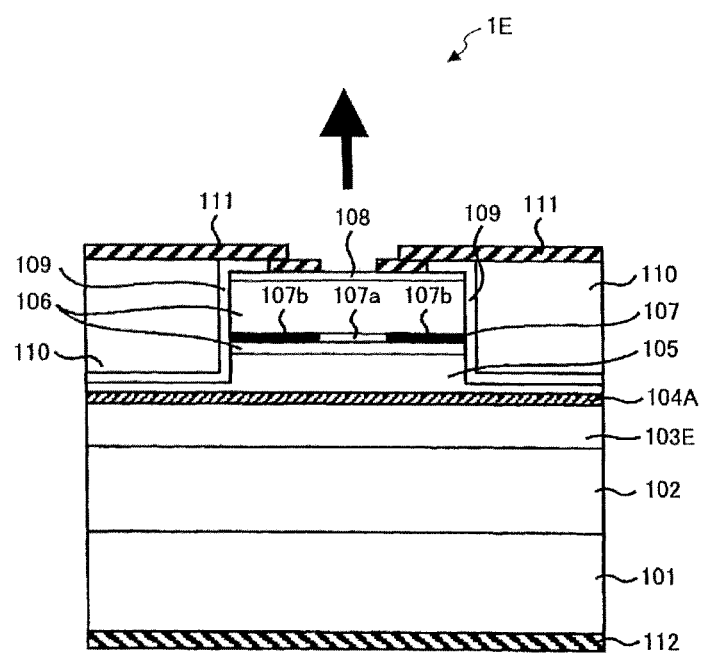
FIG. 35 is a cross-sectional view of a modification of the surface-emitting laser element in the surface-emitting laser array of FIG. 1.

FIG. 35 is a cross-sectional view of a modification of surface-emitting laser elements 1-32 of FIG. 1.

In this embodiment, each of the surface-emitting laser elements 1-32 of FIG. 1 is constituted by the surface-emitting laser element 1E of FIG. 35. As shown in FIG. 35, in the surface-emitting laser element 1E, the resonator spacer layer 103 and the active layer 104 of the surface-emitting laser element 1 of FIG. 3 are replaced by the resonator spacer layer 103E and the active layer 104A, respectively, and the other composition is the same as that of the surface-emitting laser element 1.

The resonator spacer layer 103E is constituted by non-doped AlGaAs and formed on the reflection layer 102. The active layer 104A is constituted by an AlGaAs base material and provided to emit a 780 nm laser beam.

In the surface-emitting laser element 1E, the bottom of the mesa structure is located in the middle of the resonator spacer layer 105.

Figure 36:
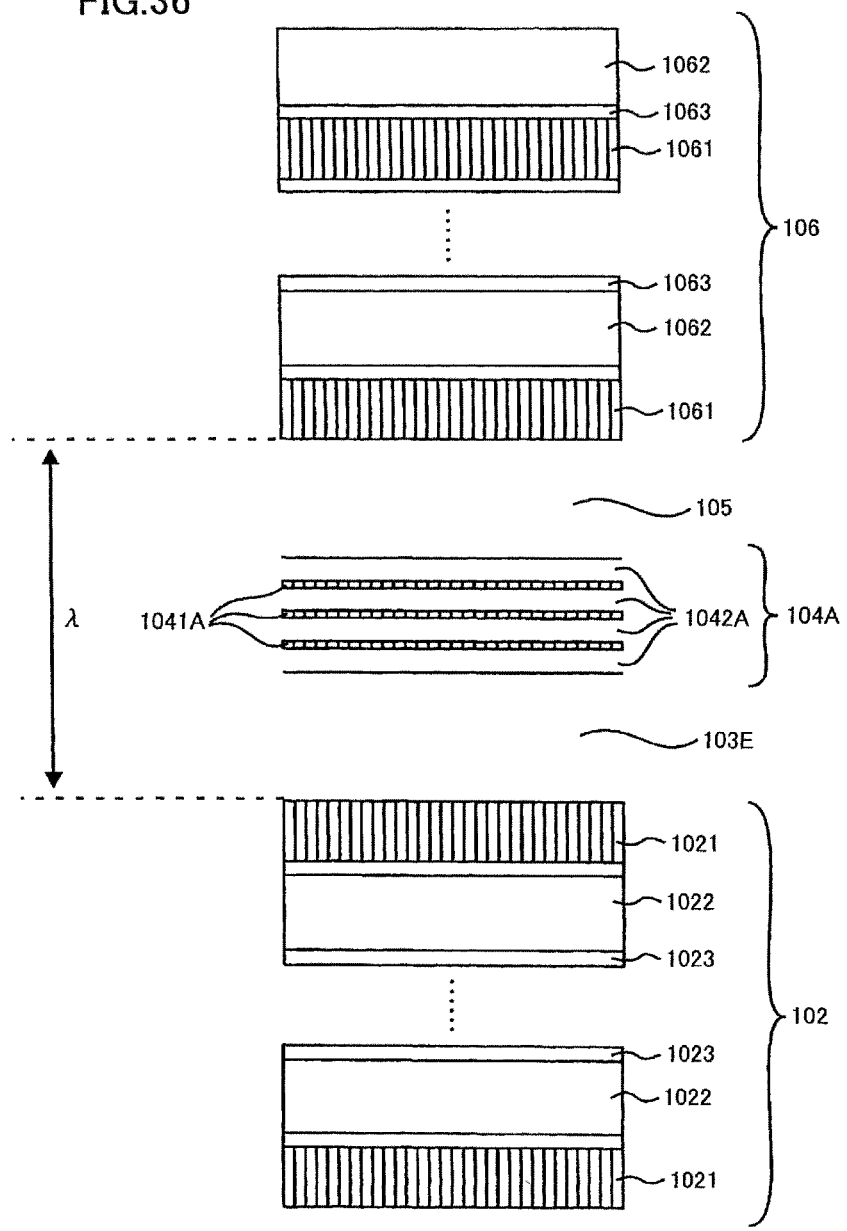
FIG. 36 is a cross-sectional view showing the neighborhood of the active layer of the surface-emitting laser element of FIG. 35.
Figure 37:
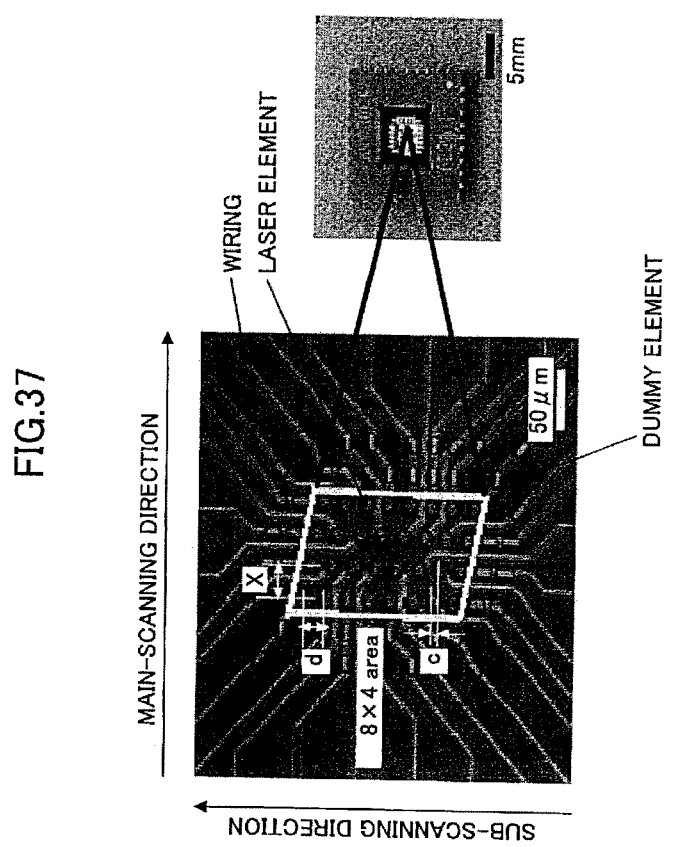
FIG. 37 is a plan view of a surface-emitting laser array according to the related art.

FIG. 36 is a cross-sectional view showing the neighborhood of the active layer 104A of the surface-emitting laser element 1E of FIG. 35. As shown in FIG. 36, the resonator spacer layer 103E is formed in contact with the low refractive index layer 1021 and the active layer 104A of the reflection layer 102.

The resonator spacer layer 103E is constituted by $Al_{0.6}Ga_{0.4}As$. The active layer 104A is constituted by the quantum well structure in which three well layers 1041A and four barrier layers 1042A are laminated alternately. Each well layer 1041A is constituted by $Al_{0.12}Ga_{0.88}As$. Each barrier layer 1042A is constituted by $Al_{0.3}Ga_{0.7}As$.

In the surface-emitting laser element 1E, the resonator spacer layers 103E and 105 and the active layer 104A constitute a resonator, and the thickness of the resonator in a direction perpendicular to the substrate 101 is set to one wavelength ($=\lambda$) of the surface-emitting laser element 1E. That is, the resonator spacer layers 103E and 105 and the active layer 104A constitute a one-wave resonator.

The surface-emitting laser array 100 including the surface-emitting laser elements 1E is produced according to the manufacturing process of FIGS. 4A-6B.

In this case, in the process of FIG. 4A, $Al_{0.6}Ga_{0.4}As$ of the resonator spacer layer 103E, $Al_{0.12}Ga_{0.88}As$ of the well layer 1041A, and $Al_{0.3}Ga_{0.7}As$ of the barrier layer 1042A are formed by using trimethyl aluminum (TMA), trimethyl gallium (TMG), and arsine (AsH3) as source materials.

Since the resonator spacer layer 105 contains In, it constitutes an absorption layer which absorbs the difference of the etching depth in the in-surface direction when forming the mesa structure.

Since etching for forming the mesa structure is suspended in the middle of the resonator spacer layer 105 at the time of production of the surface-emitting laser array 100 including the surface-emitting laser elements 1E, the difference Δd in etching depth between the element-arrangement portion 120 and the flat part 130 becomes small.

Therefore, according to the invention, the difference in etching depth in the in-surface direction DR1 of the substrate 101 can be reduced without using dummy elements.

Since the difference Δd in etching depth between the element-arrangement portion 120 and the flat part 130 is small, the probability of cutting off of the wires W1-W32 can be lowered. Since the pads 51-82 are arranged in the flat part 130, it is possible to prevent the mesa structure from being damaged by the pads 51-82 at the time of wire bonding.

In this embodiment, among the reflection layer 102, the resonator spacer layer 103E, the active layer 104A, the resonator spacer layer 105, the reflection layer 106, the selective oxidation layer 107, and the contact layer 108, which constitute the surface-emitting laser element 1E, only the resonator spacer layer 105 contains In. Alternatively, this embodiment may be configured so that only the resonator spacer layer 103E contains In or only the active layer 104A contains In.

When only the resonator spacer layer 103E contains In, the resonator spacer layer 103E constitutes an absorption layer which absorbs the difference of the etching depth in the in-surface direction when forming the mesa structure, and the bottom of the mesa structure is located in the middle of the resonator spacer layer 103E.

When only the active layer 104A contains In, the active layer 104A constitutes an absorption layer which absorbs the difference of the etching depth in the in-surface direction when forming the mesa structure, and the bottom of the mesa structure is located in the middle of the active layer 104A.

In the embodiment mentioned above, the low refractive index layer 1021 of the reflection layer 102 is constituted by AlAs. Alternatively, according to the invention, the low refractive index layer 1021 may be constituted by $Al_xGa_{1-x}As$ ($0.9 \leq x \leq 1$).

The surface-emitting laser array of the invention may be constituted by a plurality of surface-emitting laser elements arranged in a two-dimensional formation other than the formation of four rows×eight columns.

The present invention is not limited to the above-described embodiments, and variations and modifications may be made without departing from the scope of the present invention.

The present application is based on and claims the benefit of priority of Japanese patent application No. 2006-226561, filed on Aug. 23, 2006, Japanese patent application No. 2006-226562, filed on Aug. 23, 2006, and Japanese patent application No. 2007-134856, filed on May 22, 2007, the entire contents of which are hereby incorporated by reference.

The invention claimed is:

1. A surface-emitting laser array comprising:
a substrate;
an element-arrangement portion provided on the substrate and including a plurality of surface-emitting laser elements arranged therein; and
a flat part provided on the substrate and arranged in a circumference of the element-arrangement portion in an in-surface direction of the substrate, wherein:
each of the plurality of surface-emitting laser elements includes a mesa structure that emits a laser beam;
each of the flat part and the element-arrangement portion includes an absorption layer that is arranged to absorb a difference of an etching depth in the in-surface direction at a time of forming the mesa structures of the plurality of surface-emitting laser elements; and
an etching bottom in an inter-element portion of the plurality of surface-emitting laser elements in the element-arrangement portion and an etching bottom in the flat part are located in the absorption layer in a direction perpendicular to the substrate and the etching bottom in the inter-element portion is higher than the etching bottom in the flat part.

2. The surface-emitting laser array according to claim 1, wherein each of the plurality of surface-emitting laser elements comprises:
a first reflection layer formed on the substrate to constitute a semiconductor Bragg reflector;
a resonator formed in contact with the first reflection layer and containing an active layer; and
a second reflection layer formed in contact with the resonator to constitute a semiconductor Bragg reflector,
wherein the absorption layer is formed in at least a part of the resonator in a thickness direction of the resonator.

3. The surface-emitting laser array according to claim 1, wherein the absorption layer is formed in an entire area of the resonator in the thickness direction of the resonator.

4. The surface-emitting laser array according to claim 1, wherein the absorption layer is formed fully in an entire area of the resonator in a thickness direction of the resonator and formed partially in a thickness direction of the second reflection layer.

5. The surface-emitting laser array according to claim 1, wherein the absorption layer contains at least In.

6. The surface-emitting laser array according to claim 1, wherein a difference between an etching depth in the inter-element portion of the plurality of surface-emitting laser elements and an etching depth in the flat part is equal to or less than one half of an emission wavelength of each of the plurality of surface-emitting laser elements.

7. The surface-emitting laser array according to claim 1, wherein an interval between two adjacent ones of the plurality of surface-emitting laser elements in the inter-element portion is set to a smaller one of an interval between top surface positions of two mesa structures in the plurality of surface-emitting laser elements and an interval between bottom surface positions of the two mesa structures and said smaller interval is equal to or less than 20 micrometers.

8. The surface-emitting laser array according to claim 6, wherein an interval between two adjacent ones of the plurality of surface-emitting laser elements in the inter-element portion is set to a smaller one of an interval between top surface positions of two mesa structures in the plurality of surface-emitting laser elements and an interval between bottom surface positions of the two mesa structures and said smaller interval is equal to or less than 20 micrometers.

* * * * *

UNITED STATES PATENT AND TRADEMARK OFFICE
CERTIFICATE OF CORRECTION

| | |
|---|---|
| PATENT NO. | : 8,705,585 B2 |
| APPLICATION NO. | : 13/866445 |
| DATED | : April 22, 2014 |
| INVENTOR(S) | : Shunichi Sato et al. |

Page 1 of 1

It is certified that error appears in the above-identified patent and that said Letters Patent is hereby corrected as shown below:

Replace the related U.S. application data on the title page of the patent, with the following:

Item -- (63)  Continuation of application No. 12/090,467, filed on Apr. 16, 2008 as a Section 371 national stage of Int'l Application No. PCT/JP2007/066508 filed on August 20, 2007. --

Signed and Sealed this
Twenty-second Day of July, 2014

Michelle K. Lee
*Deputy Director of the United States Patent and Trademark Office*